United States Patent
Kamiya

(10) Patent No.: US 8,910,014 B2
(45) Date of Patent: Dec. 9, 2014

(54) CODING DEVICE, ERROR-CORRECTION CODE CONFIGURATION METHOD, AND PROGRAM THEREOF

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 49 days.

(21) Appl. No.: 13/640,568

(22) PCT Filed: Apr. 19, 2011

(86) PCT No.: PCT/JP2011/059633
§ 371 (c)(1),
(2), (4) Date: Oct. 11, 2012

(87) PCT Pub. No.: WO2011/136089
PCT Pub. Date: Nov. 3, 2011

(65) Prior Publication Data
US 2013/0031446 A1  Jan. 31, 2013

(30) Foreign Application Priority Data
Apr. 27, 2010  (JP) .................................. 2010-102479

(51) Int. Cl.
H03M 13/00  (2006.01)
H03M 13/11  (2006.01)
H03M 13/03  (2006.01)

(52) U.S. Cl.
CPC ........ *H03M 13/116* (2013.01); *H03M 13/1188* (2013.01); *H03M 13/033* (2013.01)
USPC ............................ 714/758; 714/752; 714/781

(58) Field of Classification Search
None
See application file for complete search history.

(56) References Cited

U.S. PATENT DOCUMENTS

| 8,219,868 | B1* | 7/2012 | Chaichanavong et al. ..... 714/748 |
| 8,443,257 | B1* | 5/2013 | Zeng et al. ..................... 714/758 |
| 8,595,548 | B1* | 11/2013 | Gunnam et al. ............. 714/6.24 |
| 2010/0281335 | A1* | 11/2010 | Blanksby et al. ............. 714/755 |

FOREIGN PATENT DOCUMENTS

| CN | 101662290 A | 3/2010 |
| JP | 2008-508776 A | 3/2008 |
| JP | 2009-005204 A | 1/2009 |
| JP | 2009-164759 A | 7/2009 |

(Continued)

OTHER PUBLICATIONS

Sung-Eun Park et al. "A Class of Structured LDPC Codes over GF (q) for Efficient Encoding", Proceeding of the IEEE 65th Vehicular Technology Conference, 2007, pp. 2218-2222.

(Continued)

*Primary Examiner* — Justin R Knapp
(74) *Attorney, Agent, or Firm* — Sughrue Mion, PLLC

(57) ABSTRACT

A coding device includes: an inspection matrix generating module that generates a block inspection matrix; and a coding module that generates and outputs a code word from an input message by the inspection matrix. The inspection matrix generating module includes: a degree-allocation unit that prescribes function values of the block inspection matrix by the coefficients of a self-reciprocal polynomial expression; a weight distribution determination unit that prescribes the number of components that are non-zero matrices among the components of each block of the block inspection matrix using a mask pattern; a first degree-altering unit that considers the sum of the components of the k_r-th row block of the block inspection matrix as a cyclic permutation matrix; and a second degree-altering unit that prescribes the row-block number of components that are non-zero matrices among the components of each row block excluding said k_r-th row block of the clock inspection matrix.

9 Claims, 12 Drawing Sheets

(56) References Cited

FOREIGN PATENT DOCUMENTS

| WO | 2007/072721 A1 | 6/2007 |
|---|---|---|
| WO | 2007/080827 A1 | 7/2007 |
| WO | 2010/001565 A1 | 1/2010 |

OTHER PUBLICATIONS

R.G. Gallager et al., "Low-Density Parity-Check Codes", Ire Transactions on Information Theory, 1962, pp. 21-28.

David J. C. Mackay et al., "Good Error-Correcting Codes based on Very Sparse Matrices", IEEE Transactions on Information Theory, Jan. 1999, pp. 1-55.

Seho Myung et al., "Quasi-Cyclic LDPC Codes for Fast Encoding", IEEE Transactions on Information Theory, Aug. 2005, pp. 2894-2901, vol. 51, No. 8.

Thomas J. Richardson et al., "Efficient Encoding of Low-Density Parity-Check Codes", IEEE Transactions on Information Theory, Feb. 2001, pp. 638-656, vol. 47, No. 2.

Search Report, dated Oct. 14, 2013, issued by the European Patent Office, in counterpart Application No. 11774872.3.

"Cycle and Distance Properties of Structured LDPC Codes based on Circulant Permutation Matrices", Jean-Baptise Core, et al. Information Theory, Jun. 1, 2007, pp. 1-4.

Communication dated Apr. 14, 2014, from the State Intellectual Property Office of P.R. China in counterpart Chinese application No. 201180018223.5.

\* cited by examiner

$$\begin{bmatrix} 38 & 56 & 21 & 12 & 59 & 48 & 24 & & 22 & & 6 & 32 & & 47 & 52 & 18 & 31 & 58 & 45 & & 40 & 44 & 30 & & 51 & 61 & 0 & & \\ 51 & 38 & & 12 & 59 & 48 & 24 & 16 & & 22 & 54 & & 26 & 47 & 52 & 18 & 61 & 31 & 58 & 45 & & 43 & 40 & 44 & 11 & & 0 & 0 & \\ 11 & & 60 & 56 & 21 & 12 & & 24 & 16 & 23 & 22 & 6 & 32 & 26 & 47 & 18 & 61 & 31 & & 45 & 35 & 44 & 30 & & & & 0 & 0 & \\ & 60 & & 56 & 21 & 12 & 59 & & 41 & 23 & 22 & 54 & 6 & 32 & 26 & 52 & 18 & 61 & 31 & 58 & 45 & 35 & 44 & 40 & & 0 & 0 & & \\ & 62 & 62 & 38 & 56 & & 59 & 48 & 41 & 16 & 23 & 6 & 54 & 32 & 26 & 47 & 52 & 18 & & 58 & 45 & 35 & 40 & 44 & 0 & 0 & & & \\ 40 & 60 & 62 & 60 & 38 & 21 & 12 & 59 & & 41 & 16 & 22 & 54 & 6 & 32 & 26 & 47 & 52 & 18 & 31 & 58 & 45 & 35 & 43 & & & & & \end{bmatrix}$$

CODING DEVICE, ERROR-CORRECTION CODE CONFIGURATION METHOD, AND PROGRAM THEREOF

CROSS REFERENCE TO RELATED APPLICATIONS

This application is a National Stage of International Application No. PCT/JP2011/059633 filed on Apr. 19, 2011, which claims priority from Japanese Patent Application No. 2010-102479, filed on Apr. 27, 2010, the contents of all of which are incorporated herein by reference in their entirety.

TECHNICAL FIELD

The present invention relates to a coding device, an error-correction code configuration device, and a program thereof. More specifically, the present invention relates to a coding device and the like which structure many kinds of quasi-cyclic low-density-parity-check codes with a small storage region.

BACKGROUND ART

For transmissions and storages of digital signals such as satellite communications, mobile communications, optical disks, and the like, reduction in required electric power, reduction in the size of antenna, improvements in the transmission speed (or storage capacitance), and the like are required at all times. In order to satisfy such demands, error correction coding techniques having a large coding gain are being employed. Among those, the low-density-parity-check (referred to as LDPC code hereinafter) is known as the error correction code having a large coding gain, and it is being employed more and more into the above-described various kinds digital communication systems and storage devices.

The coding device utilizing the LDPC code generates a block inspection matrix of a quasi-cyclic LDPC code, and transfers it to a coder. The coder performs coding processing on an input message that is a digital signal by utilizing the inspection matrix to generate a code word, and outputs it to a modulator. The modulator transmits it to a transmission path such as an optical fiber via a carrier wave. Alternatively, the transmission path may be replaced with a storage medium such as an optical disk.

Note here that the LDPC code not only means a single error correction coding system but is used as a general term for error correction codes having such a characteristic that the inspection matrix is sparse (most of the components in the matrix is 0, and the number of components of 1 is small). Among those, the quasi-cyclic LDPC code can constitute an error coding system having a large coding gain through using a repeat decoding method such as a sum-product algorithm or a min-sum algorithm. This will be described in more details hereinafter.

Expression 1 shows an r×n block matrix (r and n are natural numbers satisfying r≤n, and k=n−r), which shows a block inspection matrix of a quasi-cyclic LDPC code. In the cyclic permutation matrix as each of the components of the block matrix shown in Expression 1, the degree u(i, j) shows an integer between 0 and m−1 (m is an integer of 1 or larger) or a symbol −∞ (i is an integer between 0 and r−1, and j is an integer between 0 and n−1).

Further, Expression 2 shows an m×m cyclic permutation matrix P shown in Expression 1. P is a permutation matrix in which one each of "1" exists in each row and each column, and other components are "0". Further, each row vector of P is cyclic-shifted to the right from the row vector of the upper stage thereof. Only the first component of the row vector of the highest stage is "1", and the other components are "0" (the component at the far left end is considered as the 0th component).

When u is an integer between 0 and m−1, "P^u" shows a cyclic permutation matrix in which only the u-th component of the highest row vector is "1" and other components are "0". Here, "u" is called as the degree of the cyclic permutation matrix P^u. When the degree u is "0", P^u is a unit matrix in which only the diagonal component is "1". Thus, this is particularly expressed as "1". Further, in order to simplify the notation, the cyclic permutation matrix P^−∞ of the degree −∞ is to show a zero matrix in which all the components are "0".

Incidentally, "A with a superscript B (e.g., A to the power of B) is expressed as "A^B", and "A with a subscript B" is expressed as "A^B" in the lines other than numerical expressions.

$$\begin{pmatrix} P^{u(0,0)} & P^{u(0,1)} & \ldots & P^{u(0,k-1)} & \ldots & P^{u(0,n-1)} \\ P^{u(1,0)} & P^{u(1,1)} & \ldots & P^{u(1,k-1)} & \ldots & P^{u(1,n-1)} \\ \ldots & \ldots & \ldots & \ldots & \ldots & \ldots \\ P^{u(r-1,0)} & P^{u(r-1,1)} & \ldots & P^{u(r-1,k-1)} & \ldots & P^{u(r-1,n-1)} \end{pmatrix}$$ (Expression 1)

$$P = \begin{pmatrix} & 1 & & & \\ & & 1 & & \\ & & & \ldots & \\ & & & & \ldots \\ & & & & & 1 \\ 1 & & & & \end{pmatrix}$$ (Expression 2)

The code length of the quasi-cyclic LDPC code having the block matrix in a form of Expression 1 as the inspection matrix is n×m bits. Among the bit series of the m×m bits, a series whose matrix product with Expression 1 becomes zero is considered as a set of transmission bit string. On the reception side, it is judged whether or not there is an error in the reception bit string depending on whether or not the matrix product of the reception bit string and the inspection matrix of Expression 1 is zero. When there is an error, decoding processing for correcting the error is performed by using the inspection matrix with the use of the sum-product or min-sum algorithm mentioned above.

Through the above processing, the quasi-cyclic LDPC code having the inspection matrix shown in Expression 1 is determined depending on how each degree u(i, j) is to be selected regarding each (i, j). For determining the degree u(i, j), three points, i.e., the error correction capability is high, the coding processing can be performed easily, and the storage capacity required for holding the values of each of the degrees u(i, j) is small, can be taken as the guidelines for determining the degree u(i, j). The technical subject to be overcome is to provide a determining method of the degrees u(i, j) that satisfy the three points and to provide an efficient and economic coding device of the LDPC code having the inspection matrix defined according to the determined degrees u(i, j).

Among those, the error correction capability as the first guideline is known to depend on the weight distribution regarding the row and column blocks of the inspection matrix and the number of short-length cycles. The weight distribution c(w) regarding the row block shows, regarding a positive integer w, the number of row blocks i where the number of column blocks j satisfying u(i, j)≠−∞ matches w (i is an integer between 0 and r−1, j is an integer between 0 and n−1). The weight distribution v(w) regarding the column block shows the number of column blocks j where the number of column blocks i satisfying u(i, j)≠−∞ matches w.

It is known that the weight distributions v(w) and c(w) desired in terms of the error correction capability can be calculated by density evolution and the like. Further, the cycle of the inspection matrix means a closed path formed by branches connecting between vertexes by having "1" in the components of the inspection matrix as the vertexes. The number of branches in the cycle shows the length of the cycle.

FIG. 11 is an explanatory chart showing an example of the cycle (closed path) in the inspection matrix. In FIG. 11, a cycle 801 of length 4 and a cycle 802 of length 6 are illustrated. In a case of utilizing the sum-product or min-sum algorithm described above, it is considered a condition for achieving a high error correction capability not to have a short cycle of equal to or less than the length 4 such as the cycle 801. That is, regarding the error correction capability as the first guideline, it is necessary to take not only the weight distribution but also the number of short cycles into consideration.

As a technique for overcoming the above-described technical subject, there is a method shown in Non-Patent Document 3. This technique defines the degrees u(i, j) as in Expression 3 (1 is an integer satisfying 0<1<r−1) regarding the column block j where j≥k (k shows n−r).

$$u(i, j) = \begin{cases} 0 & \text{when } j = i + k + 1 \\ b_i & \text{when } j = i + k \\ x & \text{when } j = k \text{ and } i = r - 1 \\ y & \text{when } j = k \text{ and } i = \ell \\ -\infty & \text{other than above cases} \end{cases}$$ (Expression 3)

$$\begin{pmatrix} P^{u(0,0)} & P^{u(0,1)} & \ldots & \ldots & P^{u(0,k-1)} & P^{b_0} & I & & & 0 \\ P^{u(1,0)} & P^{u(1,1)} & \ldots & \ldots & P^{u(1,k-1)} & 0 & P^{b_1} & I & & \\ & & & & & & P^{b_2} & \ldots & & \\ \ldots & \ldots & & \ldots & P^y & & & \ldots & \ldots & \\ \ldots & \ldots & & \ldots & \ldots & & & & \ldots & I \\ & & & & 0 & & & & P^{b_{r-2}} & I \\ P^{u(r-1,0)} & P^{u(r-1,1)} & \ldots & \ldots & P^{u(r-1,n-1)} & P^x & 0 & & & P^{b_{r-1}} \end{pmatrix}$$ (Expression 4)

In Expression 3 and Expression 4, degrees b_0, b_1, - - -, b_r1, x are defined to be able to easily employ the coding method depicted in Non-Patent Document 4. For the values regarding the degrees u(i, j) of 0≤i<r, 0≤j<k other than the above, it is first judged whether or not u(i, j)=−∞. Then, the value of u(i, j) is determined regarding (i, j) that satisfies u(i, j)≠−∞.

FIG. 12 is a flowchart showing an example of the determining method of u(i, j) according to the techniques depicted in Non-Patent Documents 3 and 4. In the processing shown in FIG. 12, first, b_0, b_1, - - -, b_r1, x, and y are determined (step S901), and the weight distribution c(w) regarding the row block and the weight distribution v(w) regarding the column block of the inspection matrix are determined (w is an integer). Subsequently, the weight distributions v(w) and c(w) are calculated (step S902), and the row and column blocks i and j satisfying u(i, j)≠−∞ are determined according to the weight distributions (step S903).

The row and column blocks are not necessarily determined uniquely. Further, as described above, all the blocks according to the weight distributions calculated in step S902 do not necessarily have a high error correction capability. This is taken into consideration in general, and the row and column blocks i and j satisfying u(i, j)≠−∞ are determined successively from those that follow the same weight distributions by using random numbers while paying attention to the number of short cycles.

Through the processing up to step S903, whether or not all u(i, j) are −∞ can be determined. Subsequently, the column blocks are selected successively from the one with the smallest weight (step S904), and the numerical value of u(i, j*) regarding the selected column block j* is determined in such a manner that the number of the shot cycles of the matrix of Expression 4 becomes smaller (step S905). The processing of steps S904 to 905 is repeated until all u(i, j) are determined (step S906). Thereby, the numerical values of u(i, j) are determined successively regarding (i, j) satisfying u(i, j)≠−∞.

There are followings as Patent Documents related to that. Among those, in Patent Document 1, depicted is a technique which decreases the circuit scale of a coding device by performing masking processing on a parity inspection matrix according to a specific rule. In Patent Document 2, depicted is an inspection matrix generating method which acquires a plurality of compound rates with a single inspection matrix by arranging a masked quasi-cyclic matrix and a cyclic permutation matrix at prescribed positions. In Patent Document 3, depicted is a coding/decoding method which performs coding by using a parity check matrix constituted with submatrices having a specific regularity in the row and column weights.

Patent Document 1: WO 2007/072721
Patent Document 2: WO 2007/080827
Patent Document 3: Japanese Patent Application Publication 2008-508776
Non-Patent Document 1: RobertGallager, "Low-density-parity-check Codes", IEEE Transoperations on InformationTheory, January, 1962, pp 21-28
Non-Patent Document 2: D. J. C. Mackay, "Good Error-Correcting Codes Based on very sparse matrices", IEEE Transoperations on InformationTheory, March, 1999, pp 339-431
Non-Patent Document 3: Myung, Yang, Kim, "Quasi-Cyclic LDPC Codes for Fast Encoding", IEEE Transoperations on InformationTheory, August, 2005, pp 2894-2901
Patent Document 4: Richardson, Urbanke, "Efficient Encoding of Low-density-parity-check Codes", IEEE Transoperations on InformationTheory, February, 2001, pp 638-656

In the inspection matrix in a form of Expression 4 determined by the above-described technique, observed between the values of each of the degrees u(i, j) is no regularity but randomness. Thus, it is necessary to have a storage region of (k_r)log(2_m) dimension in order to hold the inspection matrix required in the structure of a coding or decoding device. However, when there is a regularity between the values of each of the degrees u(i, j), the error rate characteristic is deteriorated.

Therefore, many storage regions are required for holding the inspection matrix required in the coding device and the decoding device of the quasi-cyclic LDPC code. In particular, in a communication system which uses a plurality of different LDPC codes of different coding rates, frame lengths, error rate characteristic, and the like according to the factors such as the state of the communication path, there are such issues that still more storage regions are required for holding the inspection matrix and the time required for switching the coding device becomes greater. Patent Documents 1 and 2 are designed to overcome the above-described issues and are effective for reducing the storage region required for using a plurality of LDPC codes. However, there is no special consideration taken for shortening the time required for the switching, so that it does not overcome that point of issue. This point is not considered by the techniques in Patent Document 3 and Non-Patent Documents 1 to 4 either, so that it cannot be overcome by combining those techniques.

An object of the present invention is to provide a coding device, an error-correction code configuration method, and a program thereof, which can reduce the storage region required for using a plurality of low-density-parity-check codes (LDPC) and reduce the time for the switching at the time of using those properly.

DISCLOSURE OF THE INVENTION

In order to achieve the foregoing object, the coding device according to the present invention is a coding device for structuring a quasi-cyclic low-density-parity-check code, which includes: an inspection matrix generating module which generates a block inspection matrix of the quasi-cyclic low-density-parity-check code that has a cyclic permutation matrix where number of rows and number of columns are both q−1 or a zero matrix as components (q is an integer of 4 or larger and a power of 2), number of row blocks is r and number of column blocks is q+1 (r is an integer between 4 and q, inclusive), and i-th row block and j-th column block components (i is an integer between 0 and r−1, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer j−i as an argument; and a coding module which generates and outputs a code word by the block inspection matrix from an inputted message, wherein the inspection matrix generating module further includes: a degree allocation unit which prescribes the function value $\lambda(j-i)$ of the block inspection matrix by a coefficient of a self-reciprocal polynomial having q−1 pieces of elements of Galois field GF $(q^2)$ as roots; a weight distribution determination unit which prescribes number of components to be a nonzero matrix among components of each column block of the block inspection matrix and number of components to be a nonzero matrix among components of each row block of the block inspection matrix by using a given mask pattern; a first degree-altering unit which takes sum total of components of k_r-th block (k_r is an integer part of (q+1−r)/2) of the block inspection matrix as a cyclic permutation matrix; and a second degree-altering unit which prescribes row block number of components to be a nonzero matrix among the components of each column block excluding the k_r-th column block of the block inspection matrix.

In order to achieve the foregoing object, the error-correction code configuration method according to the present invention is an error-correction code configuration method for structuring a quasi-cyclic low-density-parity-check code, which includes: generating, by an inspection matrix generating module, a block inspection matrix of the quasi-cyclic low-density-parity-check code that has a cyclic permutation matrix where number of rows and number of columns are both q−1 or a zero matrix as components (q is an integer of 4 or larger and a power of 2), number of row blocks is r and number of column blocks is q+1 (r is an integer between 4 and q, inclusive), and i-th row block and j-th column block components (i is an integer between 0 and r−1, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer j−i as an argument; and generating and outputting, by a coding module, a code word by the block inspection matrix from an inputted message. The method further includes: when generating the block inspection matrix, prescribing, by a degree allocation unit, the function value $\lambda(j-i)$ of the block inspection matrix by a coefficient of a self-reciprocal polynomial having q−1 pieces of elements of Galois field GF $(q^2)$ as roots; prescribing, by a weight distribution determination unit, number of components to be a nonzero matrix among components of each column block of the block inspection matrix and number of components to be a nonzero matrix among components of each row block of the block inspection matrix by using a given mask pattern; taking, by a first degree-altering unit, sum total of components of k_r-th block (k_r is an integer part of (q+1−r)/2) of the block inspection matrix as a cyclic permutation matrix; and prescribing, by a second degree-altering unit, row block number of components to be a nonzero matrix among the components of each column block excluding the k_r-th column block of the block inspection matrix.

In order to achieve the foregoing object, the error-correction code configuration program according to the present invention is an error-correction code configuration program for structuring a quasi-cyclic low-density-parity-check code, which causes a computer to execute: a function of generating a block inspection matrix of the quasi-cyclic low-density-parity-check code that has a cyclic permutation matrix where number of rows and number of columns are both q−1 or a zero matrix as components (q is an integer of 4 or larger and a power of 2), number of row blocks is r and number of column blocks is q+1 (r is an integer between 4 and q, inclusive), and i-th row block and j-th column block components (i is an integer between 0 and r−1, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer j−i as an argument; and a function of generating and outputting a code word by the block inspection matrix from an inputted message. The program further causes the computer, when generating the block inspection matrix, to execute: a function of prescribing the function value $\lambda(j-i)$ of the block inspection matrix by a coefficient of a self-reciprocal polynomial having q−1 pieces of elements of Galois field GF $(q^2)$ as roots; a function of prescribing number of components to be a nonzero matrix among components of each column block of the block inspection matrix and number of components to be a nonzero matrix among components of each row block of the block inspection matrix by using a given mask pattern; a function of taking sum total of components of k_r-th block (k_r is an integer part of (q+1−r)/2) of the block inspection matrix as a cyclic permutation matrix; and a function of prescribing row block number of components to be a nonzero matrix among the components of each column block excluding the k_r-th column block of the block inspection matrix.

As described above, the present invention is designed as the structure in which: the degrees of the cyclic permutation matrix are $\lambda(j-i)$ when the components of the i-th row and the j-th column of the block inspection matrix are not a zero matrix; the degrees of the cyclic permutation matrix are $\lambda(j-i)$ also when the components of the i+1-th row and the j+1-th column of the block inspection matrix are not a zero matrix; and the degrees of the cyclic permutation matrix are $\lambda(j-i)$ also when the components of the i+2-th row and the j+2-th column of the block inspection matrix, the components of the i+3-th row and the j+3-th column of the block inspection matrix, and thereafter are not a zero matrix. Thus, the storage region required for holding the inspection matrix generated by the present invention can be reduced to be about $(q+1-r) \times r$ bits. Further, the use of the mask pattern makes it possible to generate many kinds of inspection matrices of different coding rates from the same data and further to switch the inspection matrices instantly.

Thereby, it is possible to provide the coding device, error-correction code configuration method, and program thereof, which exhibit the excellent characteristics such as being able to reduce the storage region required for using a plurality of low-density-parity-check codes (LDPC) and to reduce the time for the switching at the time of using those properly.

BRIEF DESCRIPTION OF THE DRAWINGS

FIG. 6 is an explanatory chart showing an example of an inspection matrix acquired by the operations shown in a specific operation example;

FIG. 7 is an explanatory chart showing an example of an inspection matrix acquired by the operations shown in a specific operation example;

BEST MODES FOR CARRYING OUT THE INVENTION

First Exemplary Embodiment

Hereinafter, the structure of a first exemplary embodiment of the present invention will be described by referring to the accompanying drawing FIG. 1.

The basic contents of the exemplary embodiment will be described first, and the more specific contents thereof will be described thereafter.

Figure 1:
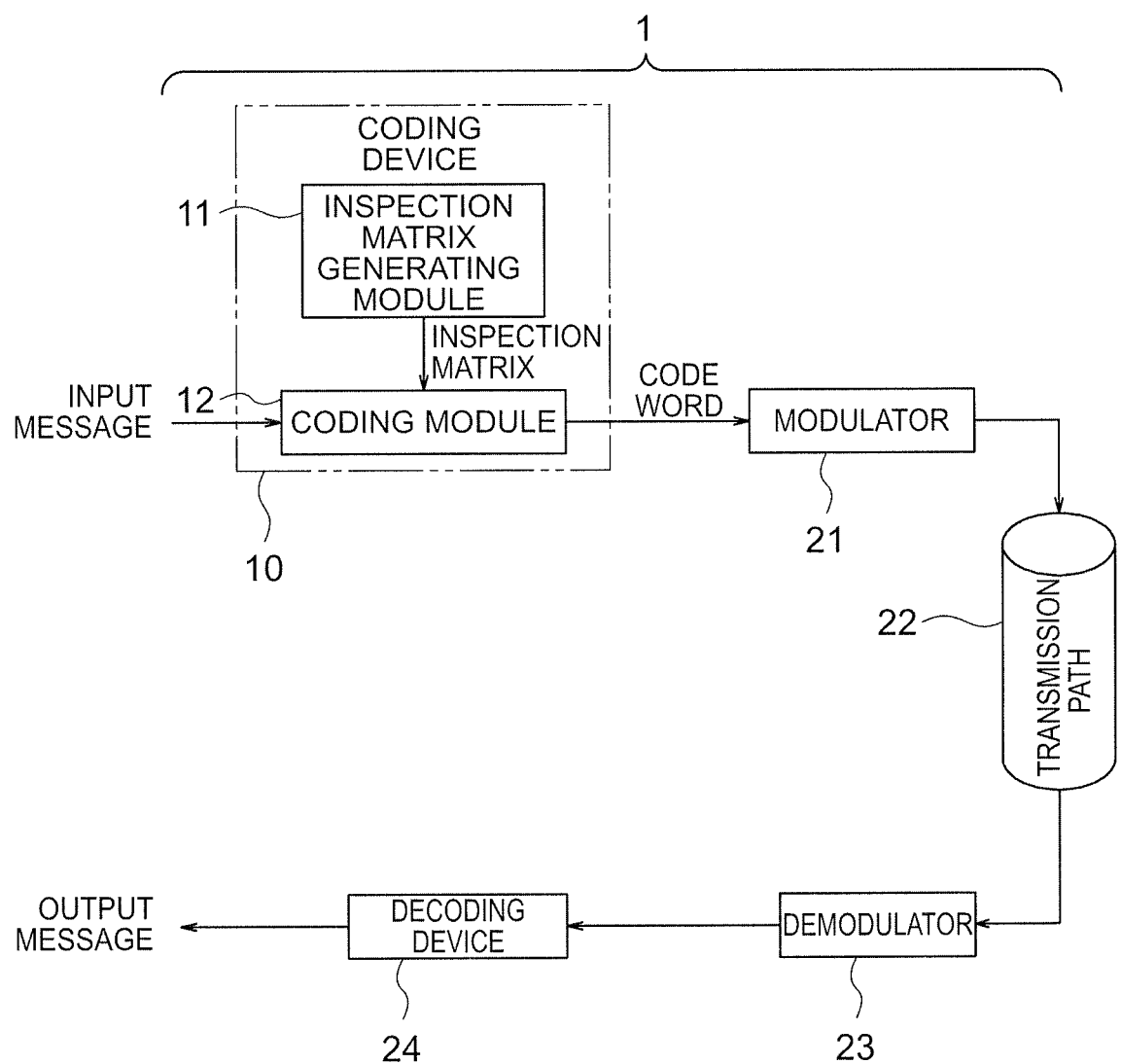
FIG. 1 is an explanatory chart showing a communication system which includes a coding device according to a first exemplary embodiment of the present invention.

As shown in FIG. 1, a coding device 10 according to the exemplary embodiment includes: an inspection matrix generating module 11 which generates a block inspection matrix of the quasi-cyclic low-density-parity-check (LDPC) code that is a cyclic permutation matrix where number of rows and number of columns are both q−1 or a zero matrix as components (q is an integer of 4 or larger and a power of 2), number of row blocks is r and number of column blocks is q+1 (r is an integer between 4 and q, inclusive), and i-th row block and j-th column block components (i is an integer between 0 and r−1, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer j−i as an argument; and a coding module 12 which generates and outputs a code word by the block inspection matrix from an inputted message.

Further, the inspection matrix generating module 11 includes: a degree allocation unit 11a which prescribes the function value $\lambda(j-i)$ of the block inspection matrix by a coefficient of a self-reciprocal polynomial having q−1 pieces of elements of Galois field GF $(q^2)$ as roots; a weight distribution determination unit 11b which prescribes number of components to be a nonzero matrix among components of each column block of the block inspection matrix and number of components to be a nonzero matrix among components of each row block of the block inspection matrix by using a given mask pattern; a first degree-altering unit 11c which takes sum total of components of k_r-th block (k_r is an integer part of $(q+1-r)/2$) of the block inspection matrix as a cyclic permutation matrix; and a second degree-altering unit 11d which prescribes row block number of components to be a nonzero matrix among the components of each column block excluding the k_r-th column block of the block inspection matrix.

Further, the coding module 12 includes: a matrix data saving memory 33 which stores the block inspection matrix generated by the inspection matrix generating module and the mask pattern; r-pieces of matrix multiplication devices 31 which calculate matrix products of information bit strings of the message and the cyclic permutation matrix whose degree is the value of the function $\lambda(j-i)$ having the integer j−i prescribed by the coefficient of the self-reciprocal polynomial having the q−1 pieces of elements of the Galois field GF $(q^2)$ as the roots as the argument; and a selector 32 which switches input signals to the matrix multiplication devices according to the mask pattern held to the matrix data saving memory.

Further, the matrix data saving memory 33 includes: a function which holds row numbers of all the row blocks whose components in the column blocks are nonzero cyclic permutation matrices in all the column blocks of a plurality of the block inspection matrices; and a function which alters input signals to the selector for each of the block inspection matrices.

By providing such structure, the coding device 10 can reduce the storage region required when using a plurality of LDPC codes in a differentiated manner and to reduce the overhead required for the switching thereof.

Hereinafter, this will be described in more details.

FIG. 1 is an explanatory chart showing a communication system 1 which includes the coding device 10 according to the first exemplary embodiment of the present invention. The communication system 1 is constituted with: the coding device 10 which generates a code word from a message that is a digital signal inputted from a communication device, a storage device, or the like; a modulator 21 which modulates the code word outputted from the coding device 10 and loads it on a carrier wave; a transmission path 22 which transmits the carrier wave outputted from the modulator 21; a demodulator 23 which extracts the code word from the carrier wave transmitted via the transmission path 22; and a decoding device 24 which decodes the extracted code word and extracts the original message. Alternatively, the transmission path 22 may be replaced with a storage medium such as an optical disk or a magnetic disk.

The coding device 10 includes: an inspection matrix generating module 11 which generates a block inspection matrix of a quasi-cyclic LDPC code; and a coding module 12 which generates a code word from an inputted message by using the block inspection matrix. Expression 5 shows the block inspection matrix generated by the inspection matrix generating module 11.

$$\begin{pmatrix} P^{u(0,0)} & P^{u(0,1)} & \ldots & \ldots & P^{u(0,k-1)} & P^{u(0,k)} & I & & & 0 \\ P^{u(1,0)} & P^{u(1,1)} & \ldots & \ldots & P^{u(1,k-1)} & P^{u(1,k)} & I & I & & \\ & & & & & & & I & \ldots & \\ \ldots & \ldots & & \ldots & \ldots & & & & \ldots & \ldots \\ \ldots & \ldots & & \ldots & \ldots & & & & \ldots & I \\ & & & & & & & & I & I \\ P^{u(r-1,0)} & P^{u(r-1,1)} & \ldots & \ldots & P^{u(r-1,k-1)} & P^{u(r-1,k-1)} & 0 & & & I \end{pmatrix}$$ (Expression 5)

Incidentally, in Expression 5, u(i, j) defined as regarding $0 \leq i < r$, $k \leq j < n$ in Expression 1 described above is defined as $u(i, j) = 0$ only when $j = k+i$ or $j = k+1+i$ applies and defined as $u(i, j) = -\infty$ in other cases.

Figure 2:
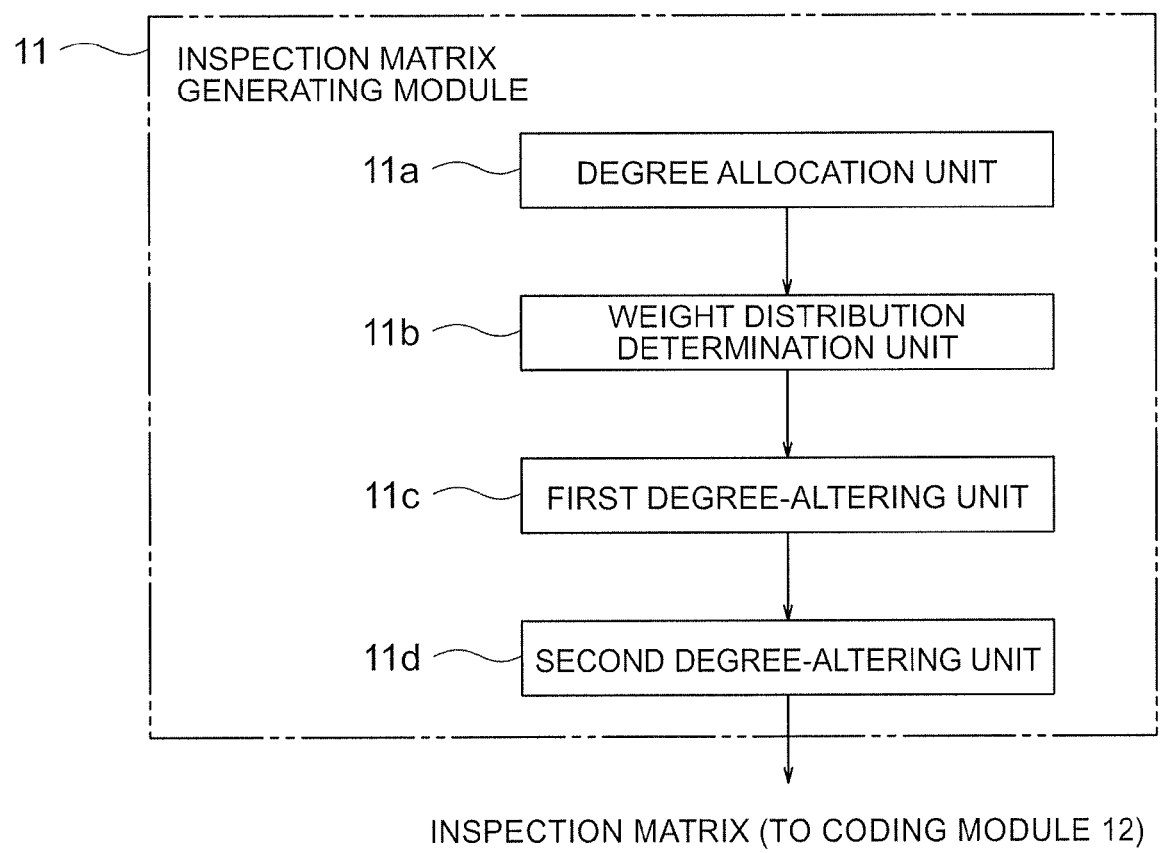
FIG. 2 is an explanatory chart showing a more detailed structure of an inspection matrix generating module shown in FIG. 1.

In order to simplify the explanations hereinafter, q is defined as a power of 2 ($q = 2^s$; s is an integer of 2 or larger), r is defined as a positive integer between 4 and q, inclusive, and k is defined as $q+1-r$. Further, each of the number of rows and the number of the columns of the cyclic permutation matrix P shown in FIG. 2 is defined as $q-1$. Expression 5 is a block matrix in which the number of row blocks is r and the number n of column blocks is (q+1).

Figure 3:
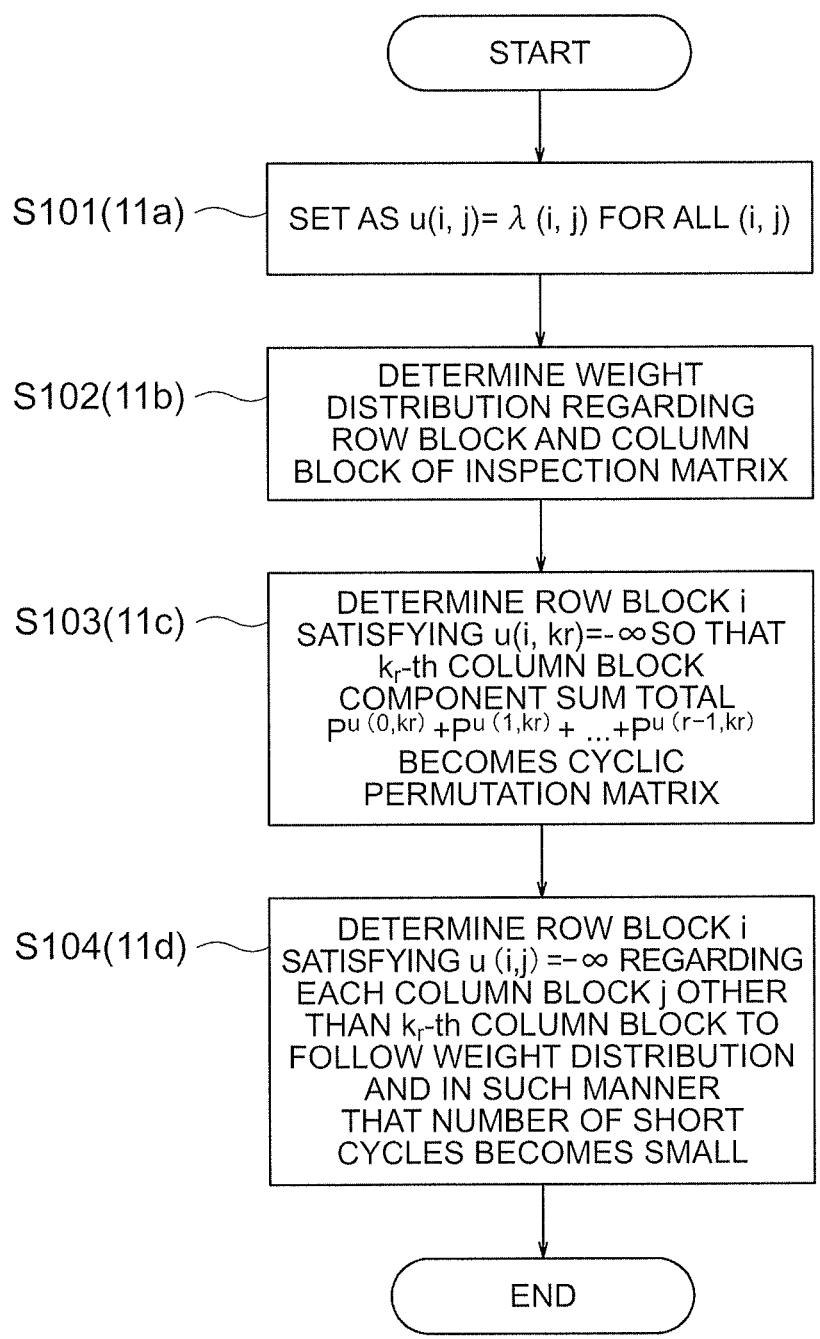
FIG. 3 is a flowchart showing operations for generating a block inspection matrix executed by the inspection matrix generating module shown in FIG. 2.

FIG. 2 is an explanatory chart showing a more detailed structure of the inspection matrix generating module 11 shown in FIG. 1. Further, FIG. 3 is a flowchart showing operations for generating the block inspection matrix (Expression 5) executed by the inspection matrix generating module 11 shown in FIG. 2. The operations are for determining u(i, j) for $r \times (k+1)$ pieces of components of the block inspection matrix shown in Expression 5 (i is an integer between 0 and $r-1$, j is an integer between 0 and k).

The inspection matrix generating module 11 includes operation units such as a degree allocation unit 11a, a weight distribution determination unit 11b, a first degree-altering unit 11c, and a second degree-altering unit 11d.

The degree allocation unit 11a first allots $u(i, j) = \lambda(j-i)$ to all u(i, j) (step S101). Note here that $\lambda(t)$ is a positive integer defined through a procedure described next when $t+r+(q/2)$ cannot be divided by $q+1$ for an integer t. When $t+r+(q/2)$ is a multiple of $q+1$, it is defined that $\lambda(t) = -\infty$.

The method for determining $\lambda(t)$ for the integer t will be described. $\beta$ is defined as a primitive element of Galois field $GF(q^2)$. For all integers h satisfying $-(q-2)/2 \leq h \leq (q-2)/2$, a polynomial of Expression 6 having $\beta^h$ as zero is defined as g(x) and a coefficient of t-degree term thereof is defined as g_t.

$$g(x) = x \sum_{h=-(q-2)/2}^{(q-2)/2} (x - \beta^{h(q-1)})$$ (Expression 6)

-continued
$$= g_0 + g_1 x + g_2 x^2 + g_3 x^3 + \ldots + g_q x^q$$

The coefficient g_t of Expression 6 mentioned above is $g\_0 = 0$, and it is $g\_t = g\_(q+2-t)$ for cases of $0 < t \leq q$. Such polynomial with which there is no change even when its low-degree term coefficient and high-degree term coefficient are in a reversed order is called a self-reciprocal polynomial. Further, regarding $0 < t \leq q$, the coefficient g_t can be expressed by a power of $\beta^t$ by using the primitive element $\beta$. The exponential is expressed as $\mu(t)$. That is, $g\_t = (\beta^{(q+1)})^{\mu(t)}$. An argument t of $\mu(t)$ is expanded to all integers except for multiples of $q+1$ to be $\mu(t) = \mu(t \bmod (q+1))$. Further, regarding the integer t with which $t+r+(q/2)$ cannot be divided by $q+1$, $\lambda(t)$ mentioned above is defined as Expression 7 by using the integer $\mu(t)$.

$$\lambda(t) = \left(\mu\left(t + r + \frac{q}{2}\right) - \mu\left(\frac{q}{2}\right)\right) \bmod (q-1)$$ (Expression 7)

Further, regarding the integer t with which $t+r+(q/2)$ can be divided by $q+1$, it is defined as $\lambda(t) = -\infty$ for convenience' sake. As described above, the integer value $\lambda(t)$ is calculated in step S101, and $u(i, j) = \lambda(j-i)$ is set for all u(i, j). Thereby, Expression 1 mentioned above can be expressed in a form of Expression 8 shown below.

$$\begin{pmatrix} P^{\lambda(0)} & P^{\lambda(1)} & P^{\lambda(2)} & \ldots & \ldots & P^{\lambda(k)} & P^{\lambda(k+1)} & P^{\lambda(k+2)} & & P^{\lambda(q)} \\ P^{\lambda(q)} & P^{\lambda(0)} & P^{\lambda(1)} & \ldots & \ldots & P^{\lambda(k-1)} & P^{\lambda(k)} & P^{\lambda(k+1)} & & P^{\lambda(q-1)} \\ P^{\lambda(q-1)} & P^{\lambda(q)} & P^{\lambda(0)} & \ldots & & P^{\lambda(k-2)} & P^{\lambda(k-1)} & P^{\lambda(k)} & & P^{\lambda(q-2)} \\ & & & \ldots & & & & & \ldots & \ldots \\ & & & & \ldots & & & & & \\ P^{\lambda(k+2)} & P^{\lambda(k+3)} & \ldots & P^{\lambda(0)} & P^{\lambda(1)} & P^{\lambda(2)} & \ldots & & P^{\lambda(k)} & P^{\lambda(k+1)} \\ P^{\lambda(k+1)} & P^{\lambda(k+2)} & \ldots & P^{\lambda(q)} & P^{\lambda(0)} & P^{\lambda(1)} & \ldots & & P^{\lambda(k-1)} & P^{\lambda(k)} \end{pmatrix}$$ (Equation 8)

Then, the weight distribution determination unit 11b determines the weight distribution regarding the row blocks and column blocks of the inspection matrix of Expression 8 mentioned above (step S102). In view of increasing the error correction capability, normally, the weight distribution is determined by using the density evolution. However, the method herein is not limited to the density evolution. It is to be noted that the column weight is defined as 2 for all the blocks from the k+1-th column block to the q-th column block.

All u(i, j) are already determined as λ(j−i) in step S101. However, a part of u(i, j) is changed by steps S103 to 104 shown in the followings to −∞ to match the weight distribution calculated in step S102.

Since λ(k)=λ(k+1)=0 from Expression 7 mentioned above, the matrix of Expression 8 comes to be in a form of the matrix of Expression 5 by changing u(i, j) regarding 0≤i<r, k<j<n to u(i, j)=−∞ in a case where j≠k+i and j≠k+1+i. Therefore, it is to be noted that u(i, j) regarding 0≤i<r, k<j<n is changed as u(i, j)=−∞ in a case where j≠k+i and j≠k+1+i.

The first degree-altering unit 11c changes a part of u(i, k_r) to −∞ so that the sum total of the components of the k_r-th column block becomes a cyclic permutation matrix (step S103). Note here that k_r shows integer values shown in following Expression 9.

$$k_r = \begin{cases} \dfrac{(q+1-r)}{2} & \text{when } r \text{ is an odd number} \\ \dfrac{(q-r)}{2} & \text{when } r \text{ is an even number} \end{cases}$$

That is, k_r shows the integer part of (q+1−r)/2. An example of the method for changing a part of u(i, k_r) to −∞ so that the sum total of the components of the k_r-th column block becomes a cyclic permutation matrix will be described later.

The second degree-altering unit 11c changes a part of u(i, k_r) to −∞ for each column block j other than the k_r-th column block to which the processing is performed in step S103 (step S104). At this time, it is done to satisfy the weight distribution defined in step S102 and to reduce the number of short cycles described in FIG. 10 as small as possible. Details of the processing of step S104 will also be described later.

The operations of the inspection matrix generating module 11 will be described further. As described above, the inspection matrix generating module 11 determines all u(i, j) of the inspection matrix shown in Expression 5 (i is an integer between 0 and r−1, and j is an integer between 0 and k). As described above, it is defined in step S101 as u(i, j)=λ(j−i) according to λ(t) shown in Expression 7. In following step S102, a part of u(i, j) is changed from λ(j−i) to −∞ according to the given weight distribution of the inspection matrix. Regarding each of i and j, m(i, j) is defined as either 1 or 0, and the matrix of following Expression 10 is expressed as H(m). Further, u(i, j)*m(i, j) in Expression 10 is defined as in Expression 11.

(Expression 10)

$$\begin{pmatrix} P^{u(0,0)*m(0,0)} & P^{u(0,1)*m(0,1)} & \cdots & \cdots & P^{u(0,k-1)*m(0,k-1)} & P^{u(0,k)*m(0,k)} & I & & & 0 \\ P^{u(1,0)*m(1,0)} & P^{u(1,1)*m(1,1)} & \cdots & \cdots & P^{u(1,k-1)*m(1,1)} & P^{u(1,k)*m(1,1)} & I & I & & \\ & & & & & & & I & \cdots & \\ \cdots & \cdots & & & \cdots & \cdots & & & \cdots & \cdots \\ \cdots & \cdots & & & \cdots & \cdots & & & \cdots & I \\ & & & & & & & & I & I \\ P^{u(r-1,0)*m(r-1,0)} & P^{u(r-1,1)*m(r-1,1)} & \cdots & \cdots & P^{u(r-1,k-1)*m(r-1,k-1)} & P^{u(r-1,k-1)*m(r-1,k)} & 0 & & & I \end{pmatrix}$$

(Expression 11)

$$u(i,j)*m(i,j) = \begin{cases} u(i,j) & \text{when } m(i,j) = 1 \\ -\infty & \text{when } m(i,j) = 0 \end{cases}$$

As evident from Expression 10 and Expression 11, it is considered that m(i, j) designates whether or not to change the value of u(i, j) from λ(j−i) to −∞ according to its value. That is, for each of i and j, by setting m(i, j) to follow the weight distributions c(w) and v(w), the block matrix H(m) of Expression 10 becomes a desired inspection matrix. Regarding a positive integer w, the weight distribution c(w) regarding the row blocks shows the number of rows i where the number of columns j satisfying u(i, j)*m(i, j)≠−∞ matches w, and the weight distribution v(w) regarding the column blocks shows the number of columns j where the number of rows i satisfying u(i, j)*m(i, j)≠−∞ matches w. Through changing the value of m(i, j), the matrix H(m) also changes. Therefore, a plurality of inspection matrices can be expressed.

As described above, regarding m(i, j) of 0≤i<r and k<j≤q, it is defined as m(i, j)=1 only when j=k+i or j=k+1+i, and it is fixed as m(i, j)=0 in other cases. Thus, in this case, the number of required bits for expressing a single inspection matrix is k×r bits. As described, m(i, j) functions to mask each component of the block matrix of original Expression 5, and m(i, j) is called as a mask pattern.

In step S103, the first degree-altering unit 11c determines the row i satisfying u(i, k_r)=−∞ regarding the k_r-th column (k_r is as shown in Expression 9). The use of the above-described method is equivalent to determining the value of m(i, k_r) regarding all 0≤i<r. The weight of the k_r-th column is set to be an odd number of 3 or larger. In order to simplify the explanations, the weight of the k_r-th column is set as 3, and described is a method of setting the value of m(i, k_r) so that the sum total of the k_r-th column block of the matrix H(m) shown in Expression 10 becomes the cyclic permutation matrix by setting t. First, in a case where r is an odd number, the value of m(i, k_r) is defined by following Expression 12.

(Expression 12)

$$u(i,j) = \begin{cases} 0 & \text{when } j = i+k+1 \\ b_i & \text{when } j = i+k \\ x & \text{when } j = k \text{ and } i = r-1 \\ y & \text{when } j = k \text{ and } i = \ell \\ -\infty & \text{other than above cases} \end{cases}$$

Through setting the values in the manner described above, the sum total of each of the components of the k_r-th column block of the matrix H(m) shown in Expression 10 becomes the cyclic permutation matrix whose degree is u((r+1)/2, k_r). Further, in a case where r is an even number of 6 or larger, the value of m(i, k_r) is defined by following Expression 13.

$$m(i, k_r) = \begin{cases} 1 & i = 0, r/2, r-2 \\ 0 & \text{cases other than the above} \end{cases} \quad \text{(Expression 13)}$$

At this time, the sum total of each of the components of the k_r-th column block of the matrix H(m) shown in Expression 10 becomes the cyclic permutation matrix whose degree is u(r/2, k_r). At last, in a case where r is 4, it is defined that m(0, k_4)=1, m(1, k_4)=0, m(2, k_4)=1, and m(3, k_4)=1. At this time, the sum total of each of the components of the k_4-th column block of the matrix H(m) becomes the cyclic permutation matrix whose degree is u(3, k_4).

Figure 4:
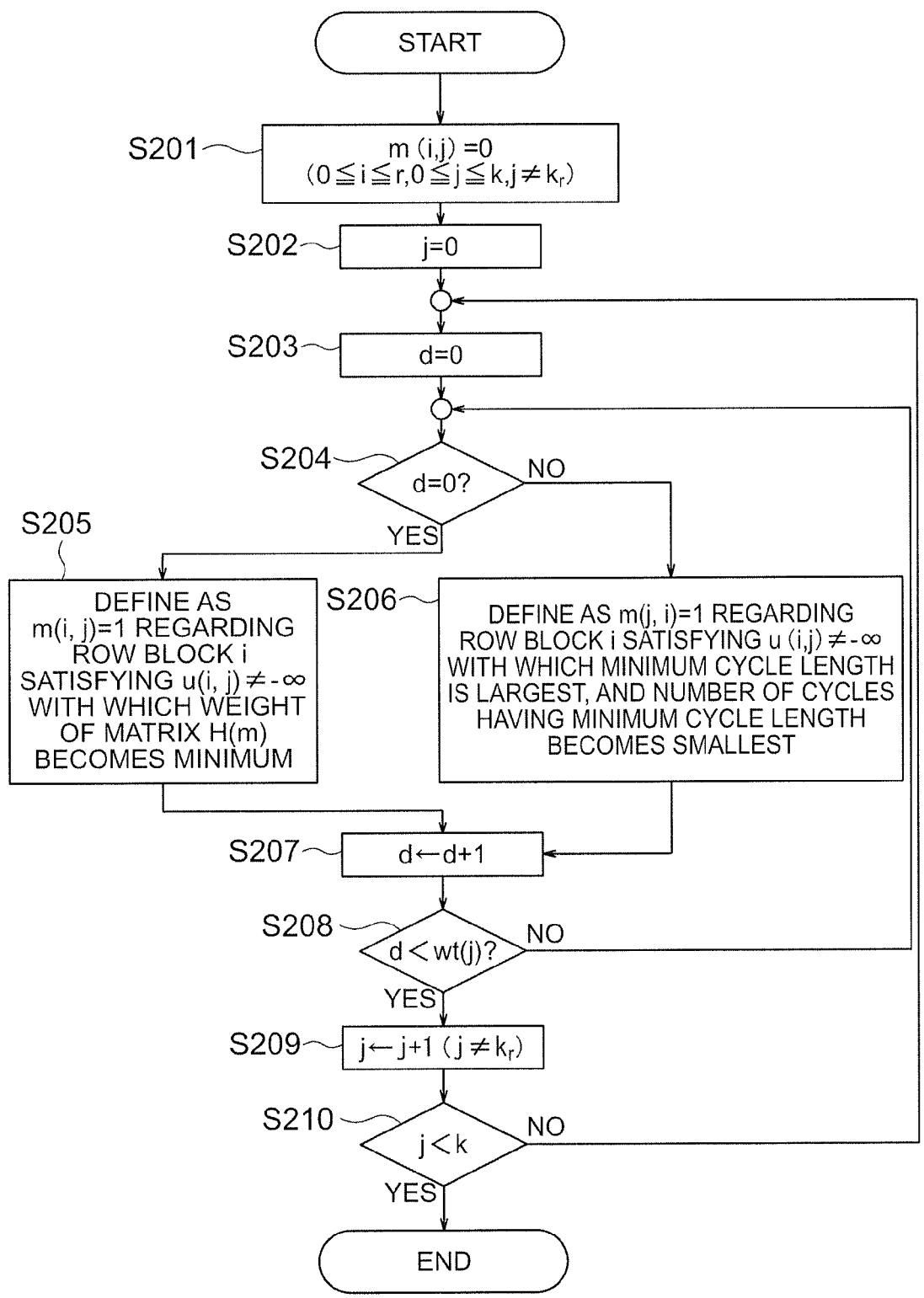
FIG. 4 is a flowchart showing details of processing executed by a second degree-altering unit shown as step S104 in FIG. 3.

In following step S104, the second degree-altering unit 11d determines the values of m(i, j) for all the columns j except for the k_r-th column. FIG. 4 is a flowchart showing the details of the processing executed by the second degree-altering unit 11d shown as step S104 of FIG. 3. First, the second degree-altering unit 11d sets as m(i, j)=0 for all the columns j except for the k_r-th column as the initial state (step S201).

Subsequently, the second degree-altering unit 11d determines the rows i satisfying m(i, j)=1 for each of the column j (steps S202 to 204). First, in a case where the weight of the column j (the number of rows i satisfying m(i, j)=1 is zero, the row number i satisfying u(i, j)≠−∞ and having the smallest weight among the row blocks of H(m) is selected (i is an integer between 0 and r−1) regarding the matrix H(m) shown in Expression 10, and it is defined as m(i, j)=1 (step S205).

Then, the row number i satisfying u(i, j)≠−∞ and having the longest minimum cycle length in the matrix H(m) and with which the number of minimum-length cycles becomes the minimum is selected, and it is defined as m(i, j)=1 (step S206). In a case where the row number i is not defined uniquely, it is selected randomly from the row numbers satisfying the above-described condition.

Thereafter, the processing of steps S204 to 206 is continued (steps S207 to 208) until the weight of the column j (the number of the row numbers i satisfying m(i, j)=1) matches the weight (weight of the column j is expressed as wt(j) in FIG. 4) defined for each column in step S102 of FIG. 3. The inspection matrix H(m) is acquired by performing the processing heretofore for all the columns except for the column k_r (steps S209 to 210).

In order to simplify the coding processing, the inspection matrix calculated in the above-described procedure is used by exchanging the k-th column block with the column block acquired by uniformly cyclic-shifting each of the components of the k_r-th column block so that the sum total of the k_r-th column block becomes a unit matrix. Further, the r×n block inspection matrix regarding an integer n that does not match q+1 is generated by generating r×(q+1) block matrix by the above-described measures regarding n<q+1 and by selecting n-pieces of column blocks containing the r-pieces of column blocks on the right end among the q+1-pieces of column blocks.

Figure 5:
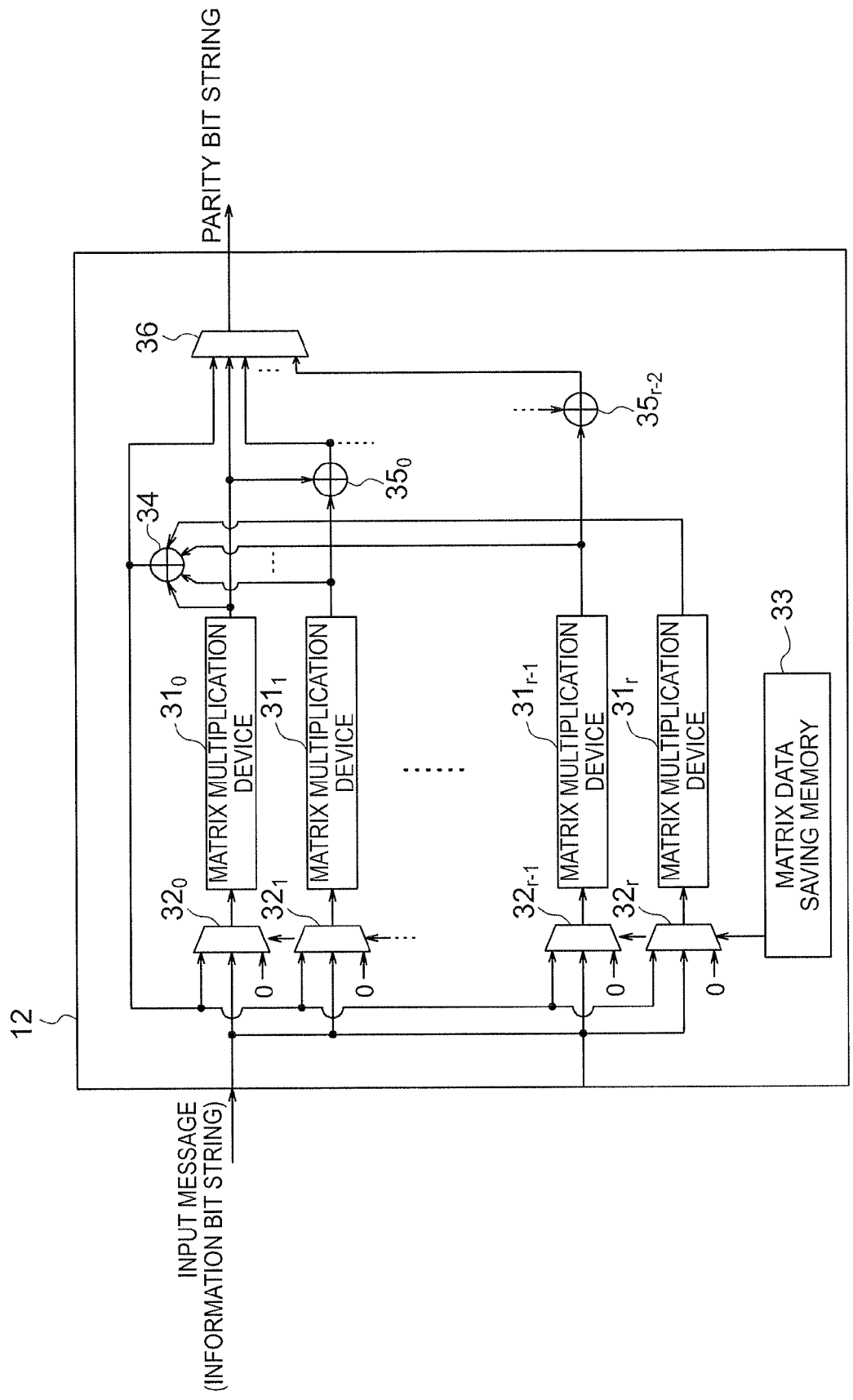
FIG. 5 is an explanatory chart for describing the structure of a coding module shown in FIG. 1.

FIG. 5 is an explanatory chart for describing the structure of the coding module 12 shown in FIG. 1. With the inspection matrix generating method described above, it is possible to change to the code having another parameter by simply changing the mask pattern m(i, j). Thus, as will be described next, the coding module 12 can be structured to be compatible by simply changing the mask pattern.

The coding module 12 includes the same number of matrix multiplication devices 31_0, 31_1, - - - , 31_(r−1) as the row block number r of the inspection matrix shown in Expression 5. The coding module 12 also includes selectors 32_0, 32_1, - - - , 32_(r−1) for selecting input data to the r-pieces of matrix multiplication devices 31, and a matrix data saving memory 33 for outputting data of r-bits to be the switching signal of the selectors. Further, the coding module 12 also includes exclusive OR calculation devices 34, 35_0, 35_1, - - - , 35_(r−2) and a selector 36.

Further, the coding module 12 can change the LDPC code inspection matrix to be used according to the data held in the matrix data saving memory 33. In this case, the storage region required for holding a single piece of matrix data is of k×r bits.

Hereinafter, described is an example of a case where the coding module 12 performs coding of an information bit string of an input message by the quasi-cyclic LDPC code with the inspection matrix shown in Expression 10, adds (q−1)×r bits of parity bits to the input of the information bit number of (q−1)×k bits, and outputs those. In this case, one frame is constituted with an information bits and redundant bits. The total bit number of one frame becomes q^2−1 bits, since k=q+1−r as described above.

The parity bits of (q−1)×r bits are determined in such a manner that the product of the inspection matrix and the matrix of the frame becomes zero. The coding module 12 inputs the information bits in k-times by every (q−1) bits, and inputs each of those to the r-pieces of matrix multiplication devices 31 via the selector 32.

The i-th matrix multiplication device 31_i (i is an integer between 0 and r−1) includes a register inside thereof. When an information bit string constituted with the j-th q−1 bits among the k-times of inputs of the information bits is inputted to the selector 32 (j is an integer between 0 and k−1), the i-th matrix multiplication device 31_i calculates the matrix product of the output of the selector 32 and the matrix P^u(i, j), and the results acquired by adding the calculated result and the data held by the inside register of the matrix multiplication device 311 is held to the same register.

Note here that the initial value of the inside register of the matrix multiplication device 311 is set to 0, and "adding" herein means an exclusive OR operation of each bit. Further, the selector 32 takes the information bit string constituted with the j-th q−1 bits, zero bit, and the output of the exclusive OR calculation device 34, and takes the mask pattern m(i, j) held to the matrix data saving memory 33 as a switching signal. The selector 32 outputs the information bit string constituted with the j-th q−1 bits to the matrix multiplication device 311 as described above when m(i, j)=1, and outputs zero bit to the matrix multiplication device 311 when m(i, j)=0.

When the information bit string of (q−1)×k bits is written as a_0^(j), a_1^(j), - - - , a_(q−2)^(j), j=0, 1, - - - , and k−1, the q−1-bit data b_0^(i), - - - , b_(q−2)^(i), i=0, 1, - - - , r−1 held by the inside register of the matrix multiplication device 31_i at the stage where the entire information bits are completely inputted matches the data expressed as the matrix in following Expression 14.

$$(b_0^{(i)}, b_1^{(i)}, \ldots, b_{q-2}^{(i)})^T = \sum_{j=0}^{k-1} P^{m(i,j)*u(i,j)} (a_0^{(j)}, a_1^{(j)}, \ldots, a_{q-2}^{(j)})^T \quad \text{(Expression 14)}$$

In Expression 14, T shows a transposed matrix. b_0^(i), b_1^(i), - - - , b^(q−2)^(i), - - - , i=0, 1, - - - , r−1 are added by every bit by the exclusive OR 304 and become parity bits p__0^(0), p__1^(0), - - - , p_(q−2)^(0) of q−1 bits shown in Expression 15.

$$(p_0^{(0)}, p_1^{(0)}, \ldots, p_{q-2}^{(0)})^T = \sum_{i=0}^{r-1} (b_0^{(i)}, b_1^{(i)}, \ldots, b_{q-2}^{(i)})^T \quad \text{(Expression 15)}$$

The parity bits p__0^(0), p__1^(0), - - - , p_(q−2)^(0) shown in Expression 15 are inputted to the selector 32__i (i is an integer between 0 and r−1), selected according to the switching signal m(i, k) provided by the matrix data saving memory 33, and inputted to the r-pieces of matrix multiplication devices 31. As a result, the data b__0^(i), b__1^(i), - - - , b_(q−2)^(i), i=0, 1, - - - , r−1 held by the inside register of the matrix multiplication device 31__i (i is an integer between 0 and r−1) are updated to as shown in following Expression 16.

$$(b_0^{(i)}, b_1^{(i)}, \ldots, b_{q-2}^{(i)})^T \leftarrow (b_0^{(i)}, b_1^{(i)}, \ldots, b_{q-2}^{(i)})^T + P^{\bar{m}(i,k) \cdot u(i,k)} (p_0^{(0)}, p_1^{(0)}, \ldots, p_{q-2}^{(0)})^T \quad \text{(Expression 16)}$$

The coding module 12 uses the updated data b__0^(i), b__1^(i), - - - , b_(q−2)^(i), - - - , i=0, 1, - - - , r−1 calculate the parity bit string p__0^(i), p__1^(i), - - - , p_(q−2)^(i), - - - , i=1, 2, - - - , r−1 constituted with the remaining (q−1)×(r−1) bits by back substitution as shown in Expression 17.

$$(P_0^{(1)}, P_1^{(1)}, \ldots, P_{q-2}^{(1)})^T = (b_0^{(0)}, b_1^{(0)}, \ldots, b_{q-2}^{(0)})^T$$
$$(P_0^{(i)}, P_1^{(i)}, \ldots, P_{q-2}^{(i)})^T = (b_0^{(i-1)}, b_1^{(i-1)}, \ldots, b_{q-2}^{(i-1)})^T + (p_0^{(i-1)}, p_1^{(i-1)}, \ldots, p_{q-2}^{(i-1)})^T \quad \text{(expression 17)}$$

The matrix product of the vectors constituted with the information bit string a__0^(j), a__1^(j), - - - , a_(q−2)^(j), j=0, 1, - - - , k−1 of (q−1)×k bits, the (q−1)×r-bit parity bit string p__0^(i), p__1^(i), - - - , p_(q−2)^(i), - - - , i=1, 2, - - - , r−1 calculated thereby through the above-described procedure and the inspection matrix of Expression 10 becomes zero. The coding module 12 can be used as a coding device corresponded to another inspection matrix by simply increasing the storage region for k×r bits through changing the mask pattern held in the matrix data saving storage device in this manner.

SPECIFIC OPERATION EXAMPLE

Hereinafter, operation contents of the inspection matrix generating module 11 will be described by using specific numerical value examples, and an example of the inspection matrix generated by the inspection matrix generating module 11 according to the exemplary embodiment will be described. Provided that q is 2^6 (=64), the inspection matrix generating module 11 can generate the LDPC code inspection matrix whose code length is q^2−1=4095 bits or less.

It is so defined that β is the primitive element of a Galois field GF (2^6) and β^6+β1=0. At this time, sixty-four integers μ(1), μ(2), - - - , μ(64) derived from the coefficient g_t of t-degree terms (t is an integer between 1 and 64) of the polynomial g(x) of Expression 7 are 0, 61, 39, 57, 22, 13, 60, 49, 25, 42, 17, 24, 23, 55, 7, 33, 27, 48, 53, 19, 62, 32, 59, 46, 36, 44, 41, 45, 31, 12, 52, 1, 1, 52, 12, 31, 45, 41, 44, 36, 46, 59, 32, 62, 19, 53, 48, 27, 33, 7, 55, 23, 24, 17, 42, 25, 49, 60, 13, 22, 57, 39, 61, and 0, respectively.

Provided that the row block number r is 18, λ(0), λ(1), - - - , λ(64) of Expression 7 are 6, 54, 22, 23, 16, 41, 24, 48, 59, 12, 21, 56, 38, 60, 62, −∞, 62, 60, 38, 56, 21, 12, 59, 48, 24, 41, 16, 23, 22, 54, 6, 32, 26, 47, 52, 18, 61, 31, 58, 45, 35, 43, 40, 44, 30, 11, 51, 0, 0, 51, 11, 30, 44, 40, 43, 35, 45, 58, 31, 61, 18, 52, 47, 26, and 32, respectively.

As in the operations of the degree allocation unit 11a (step S101) shown in FIGS. 2 to 3, it is set to u(i, j)=λ(j−i) for all of u(i, j) (0≤i<18, 0≤j<65). Regarding m(i, j) of 0≤i<18, 48≤j<65, it is defined as m(i, j)=1 only when j=47+i or j=48+i and fixed as m(i, j)=0 in other cases.

The weight distribution of the weight distribution determination unit 11b (step S102) is defined as v(2)=17, v(3)=12, v(8)=7, v(0)=29, and c(7)=18. Since k__18=23 according to Expression 9, eighteen degrees u(0, 23), u(1, 23), - - - , u(17, 23) of the 23rd column block are 48, 59, 12, 21, 56, 38, 60, 62, −∞, 62, 60, 38, 56, 21, 12, 59, 48, and 24, respectively.

According to Expression 13, m(i, 23) is 1 only when i=0, 9, 16, and it is 0 in other cases. By the second degree-altering unit 11d (step S104), the mask patterns m(i, j) regarding the column blocks from the 0th column block to the 47th column block excluding the 23rd column block are determined.

From the weight distribution described above, v(0)=29. Thus, there are twenty-nine columns of the column blocks of weight 0 among the entire sixty-five column blocks, and the column blocks from the 0th column block to the 28th column block (excluding the 23rd column block) and the 47th column block are defined as zero. Each value of m(i, j) regarding the other eighteen column blocks from the 29th column block to the 46th column block is determined by the procedure shown in FIG. 4 to follow the weight distribution described above.

Then, the column block acquired by uniformly cyclic-shifting each component of the 23rd column block and the 47th column block are exchanged and used so that the sum total of the 23rd column block of the inspection matrix becomes a unit matrix.

Figure 6:
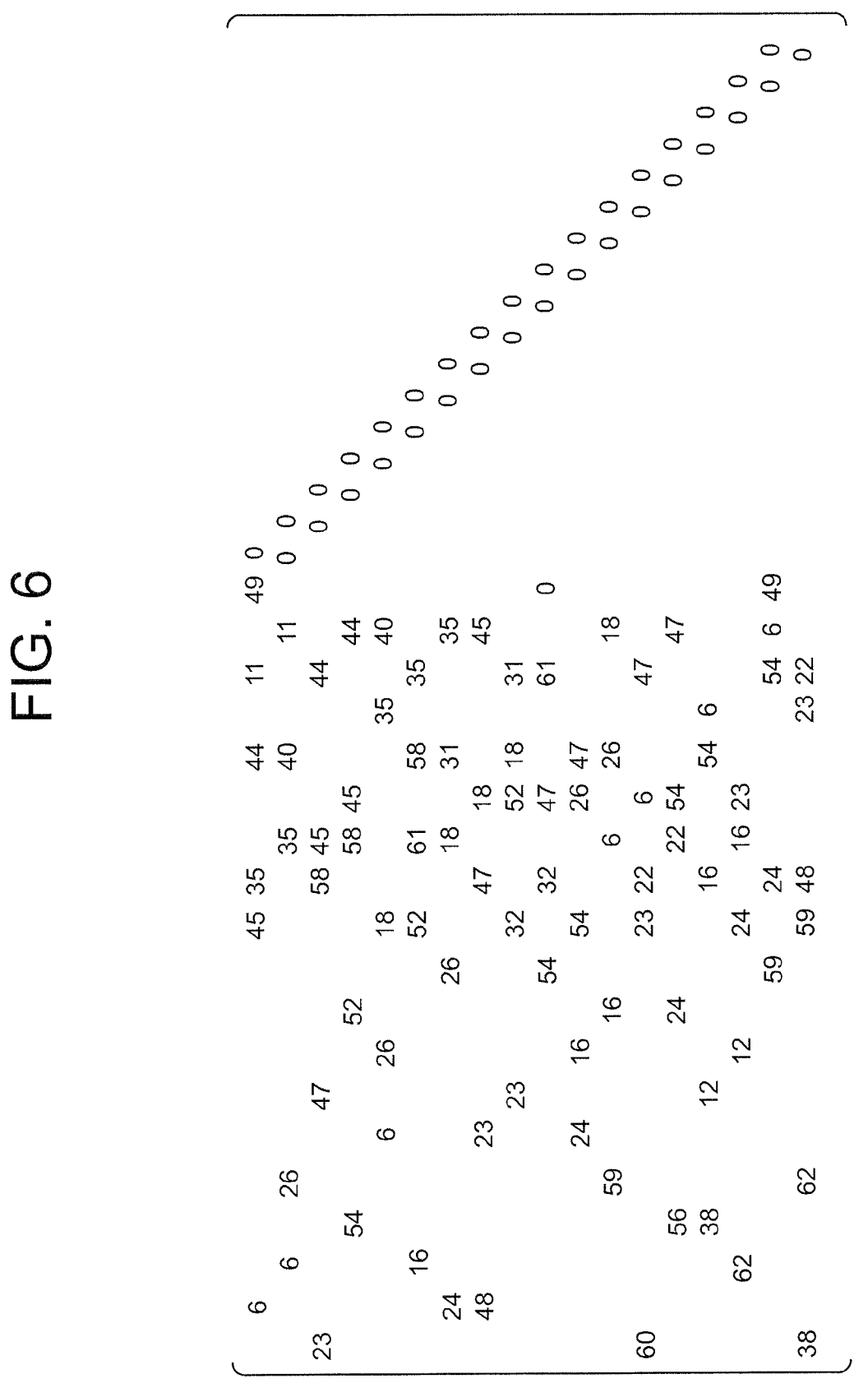

FIG. 6 is an explanatory chart showing an example of the inspection matrix acquired by the above-described operation example. In order to simplify the depiction, only the degree part of the cyclic permutation matrix P is shown as each component of the matrix of FIG. 6. Further, the blank shows an all-zero matrix (degree=−∞). The inspection matrix of FIG. 6 becomes a quasi-cyclic LDPC code inspection matrix with a ½ coding rate having a code length of 2268 bits and information length of 1134 bits.

Another example of generating an inspection matrix when the column block number r is 6 will be described. In completely the same manner as the above-described generation example, provided that q is 2^6 (=64) and β satisfying β^6+β+1=0 is the primitive element of Galois field GF (2^6), an inspection matrix is generated from the polynomial g(x) of Expression 7. According to Expression 7, λ(0), λ(1), - - - , λ(64) are 40, 43, 35, 45, 58, 31, 61, 18, 52, 47, 26, 32, 6, 54, 22, 23, 16, 41, 24, 48, 59, 12, 21, 56, 38, 60, 62, −∞, 62, 60, 38, 56, 21, 12, 59, 48, 24, 41, 16, 23, 22, 54, 6, 32, 26, 47, 52, 18, 61, 31, 58, 45, 35, 43, 40, 44, 30, 11, 51, 0, 0, 51, 11, 30, and 44, respectively.

This series is the same as the series acquired by cyclic-shifting the series of a case where r=18 shown in FIG. 6 to the right direction for twelve times. Through the operations of the degree allocation unit 11a (step S101) shown in FIGS. 2 to 3, it is set to u(i, j)=λ(j−i) for all of u(i, j) (0≤i<6, 0≤j<65). Regarding m(i, j) of 0≤i<6, 60≤j<65, it is defined as m(i, j)=1 only when j=59+i or j=60+i and it is fixed as m(i, j)=0 in other cases.

The weight distribution of the weight distribution determination unit 11b (step S102) is defined as v(2)=5, v(3)=20, v(6)=11, v(0)=29, c(22)=2, and c(23)=4. Since k__6=29 according to Expression 9, six degrees u(0, 29), u(1, 29), - - - , u(5, 29) of the 29th column block are 60, 62, −∞, 62, 60, and 38, respectively.

According to Expression 13, m(i, 29) is 1 only when i=0, 3, 4, and it is 0 in other cases. By the second degree-altering unit 11d (step S104), the mask patterns m(i, j) regarding the column blocks from the 0th column block to the 59th column block excluding the 29th column block are determined.

From the weight distribution described above, v(0)=29. Thus, there are twenty-nine columns of the column blocks of weight 0 among the entire sixty-five column blocks, and the column blocks from the 0th column block to the 28th column block are defined as zero. Further, since the 29th column block is determined in the manner described above, each value of m(i, j) regarding the other thirty column blocks from the 30th column block to the 59th column block is determined by the procedure shown in FIG. 4 to follow the weight distribution described above.

Then, the column block acquired by uniformly cyclic-shifting each component of the 29th column block and the 59th column block are exchanged and used so that the sum total of the 29th column block of the inspection matrix becomes a unit matrix. FIG. 7 is an explanatory chart showing an example of the inspection matrix acquired by the above-described operation example. In order to simplify the depiction, only the degree part of the cyclic permutation matrix P is shown as each component of the matrix of FIG. 7. Further, the blank shows an all-zero matrix (degree=–∞). The inspection matrix of FIG. 7 becomes a quasi-cyclic LDPC code inspection matrix with a 5/6 coding rate having a code length of 2268 bits and information length of 1890 bits.

Shown in FIG. 6 and FIG. 7 are two kinds of inspection matrices of different coding rates, in which the column block number r of the inspection matrix of FIG. 6 is 18 and the column block number r of the inspection matrix of FIG. 7 is 6. Both are based on the same data generated by the inspection matrix generating module 11 according to the exemplary embodiment. The numerical values of the components that are not –∞ are defined by the sequence $\mu(1), \mu(2), \text{---}, \mu(64)$ stipulated by the coefficient of the polynomial g(x). Thus, the coding processing can be executed for the both by the coding device shown in FIG. 5 by changing the mask patterns m(i, j).

Overall Operations of First Exemplary Embodiment

Next, overall operations of the above-described exemplary embodiment will be described. The error-correction code configuration method according to the exemplary embodiment is used with the coding device which is constituted with: the inspection matrix generating module which generates a block inspection matrix of the quasi-cyclic low-density-parity-check code that has a cyclic permutation matrix where number of rows and number of columns are both q–1 or a zero matrix as components (q is an integer of 4 or larger and a power of 2), number of row blocks is r and number of column blocks is q+1 (r is an integer between 4 and q, inclusive), and i-th row block and j-th column block components (i is an integer between 0 and r–1, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer j–i as an argument; and the coding module which generates and outputs a code word by the block inspection matrix from an inputted message, wherein: the degree allocation unit of the inspection matrix generating module prescribes the function value $\lambda(j-i)$ of the block inspection matrix by a coefficient of a self-reciprocal polynomial having q–1 pieces of elements of Galois field GF $(q^2)$ as roots (FIG. 3: step S101); the weight distribution determination unit of the inspection matrix generating module prescribes number of components to be a nonzero matrix among components of each column block of the block inspection matrix and number of components to be a nonzero matrix among components of each row block of the block inspection matrix by using a given mask pattern (FIG. 3: step S102); the first degree-altering unit of the inspection matrix generating module takes sum total of components of k_r-th block (k_r is an integer part of (q+1–r)/2) of the block inspection matrix as a cyclic permutation matrix (FIG. 3: step S103); and a second degree-altering unit of the inspection matrix generating module prescribes row block number of components to be a nonzero matrix among the components of each column block excluding the k_r-th column block of the block inspection matrix (FIG. 3: step S104).

Further, the block inspection matrix generated by the inspection matrix generating module and the mask pattern are stored to the matrix data saving memory of the coding module; the selector of the coding module switches input signals according to the mask pattern held to the matrix data saving memory; and the matrix multiplication devices of the coding module calculate the matrix products of information bit strings of the message and the cyclic permutation matrix having the value of the function $\lambda(j-i)$ having the integer j–i prescribed by the coefficient of the self-reciprocal polynomial having the q–1 pieces of elements of the Galois field GF $(q^2)$ as the roots as the argument as the degree.

Note here that each of the above-described operation steps may be put into a program to be executed by the coding device 10 as a computer which directly executes each of the steps. The program may be recorded in a non-transitory recording medium such as a DVD, a CD, or a flash memory. In that case, the program is read out from the recording medium by the computer and executed.

With such structure and operations, the exemplary embodiment can provide following effects.

According to the exemplary embodiment, the degree of the cyclic permutation matrix is $\lambda(j-i)$ when the components of the i-th row and j-th column blocks of the block inspection matrix are not a zero matrix. It is also the cyclic permutation matrix with the degree of $\lambda(j-i)$ when the components of the i+1-th row and j+1-th column blocks of the block inspection matrix are not a zero matrix. This is the same for the components of the i+2-th row and j+2-th column block, the components of the i+3-th row and j+3-th column block, and thereafter. Thus, the storage region required for holding the inspection matrix generated by the present invention is an order of (q+1–r)×r bits, so that it only requires a greatly smaller storage region.

Further, it is possible to generate the quasi-cyclic LDPC code inspection matrix of various types without changing the degree in case of the cyclic permutation matrix by simply selecting whether the components of the inspection matrix are the cyclic permutation matrix or the zero matrix. Thus, there is an effect of being able to reduce the time (overhead) required for switching the coding and decoding devices even in a communication system which properly uses a plurality of LDPC codes of different parameters such as the coding rate, frame length, error rate characteristic, and the like.

Second Exemplary Embodiment

In addition to the structure of the coding device 10 according to the first exemplary embodiment, a coding device 110 according to a second exemplary embodiment of the present invention is so structured that: the weight distribution determination unit 11b of the inspection matrix generating module defines all the components of q+1–n pieces of column blocks among q+1–r pieces of column blocks excluding the r–1 piece of the column block on the right end and the k_r-th column block of the q+1 pieces of the column blocks of the block inspection matrix; and the inspection matrix generating module includes a column block cancel unit 111e which cancels q+1−n pieces of column blocks whose entire components are zero matrix.

With this structure, it is possible to acquire the same effect as that of the first exemplary embodiment. Further, the column block number of the inspection matrix to be generated can be set to an arbitrary number of r+1 and q+1, inclusive, so that it is possible to generate still broader kinds of inspection matrices.

This will be described in more details hereinafter.

Figure 8:
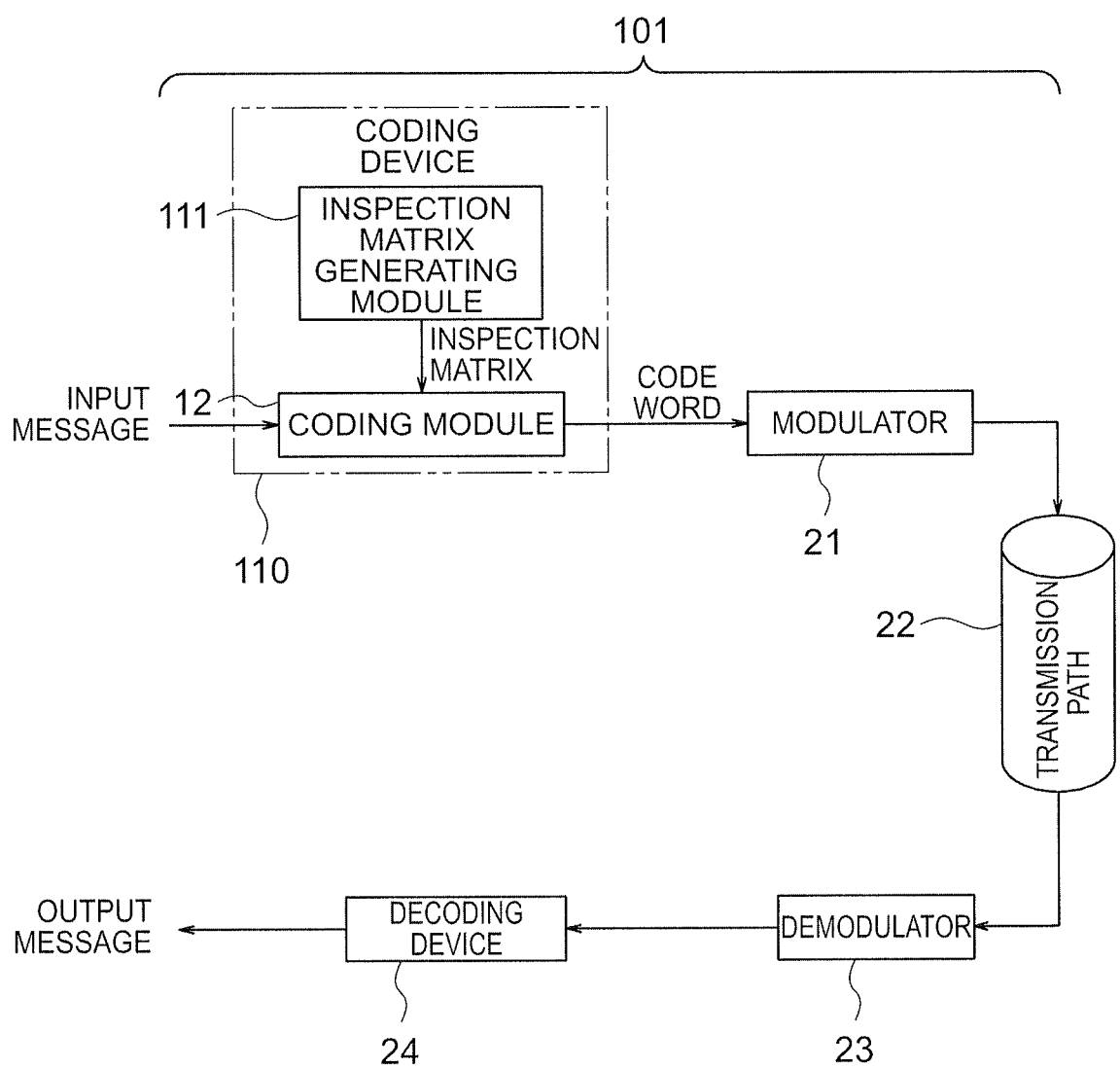
FIG. 8 is an explanatory chart showing a communication system which includes a coding device according to a second exemplary embodiment of the present invention.
Figure 9:
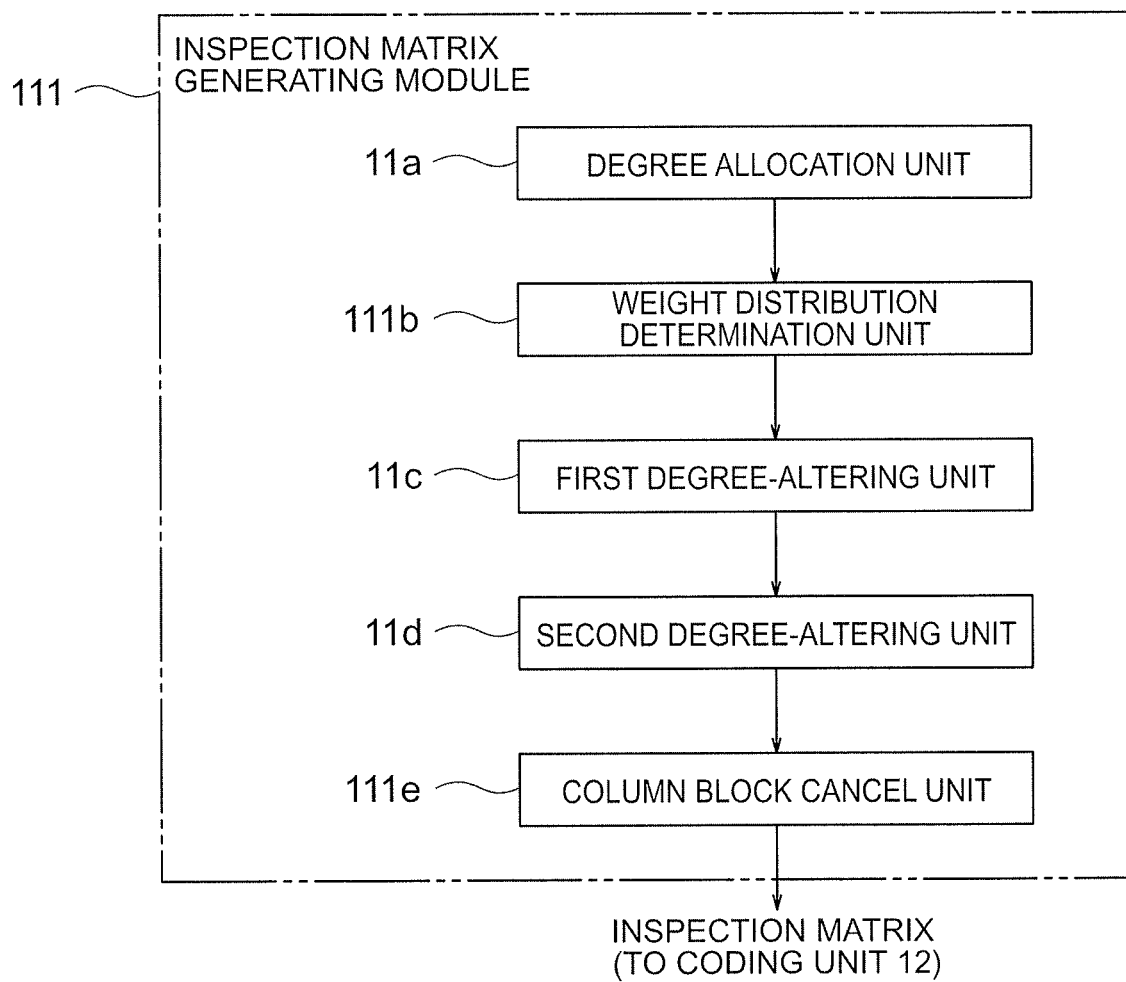
FIG. 9 is an explanatory chart showing a more detailed structure of an inspection matrix generating module shown in FIG. 8.
Figure 10:
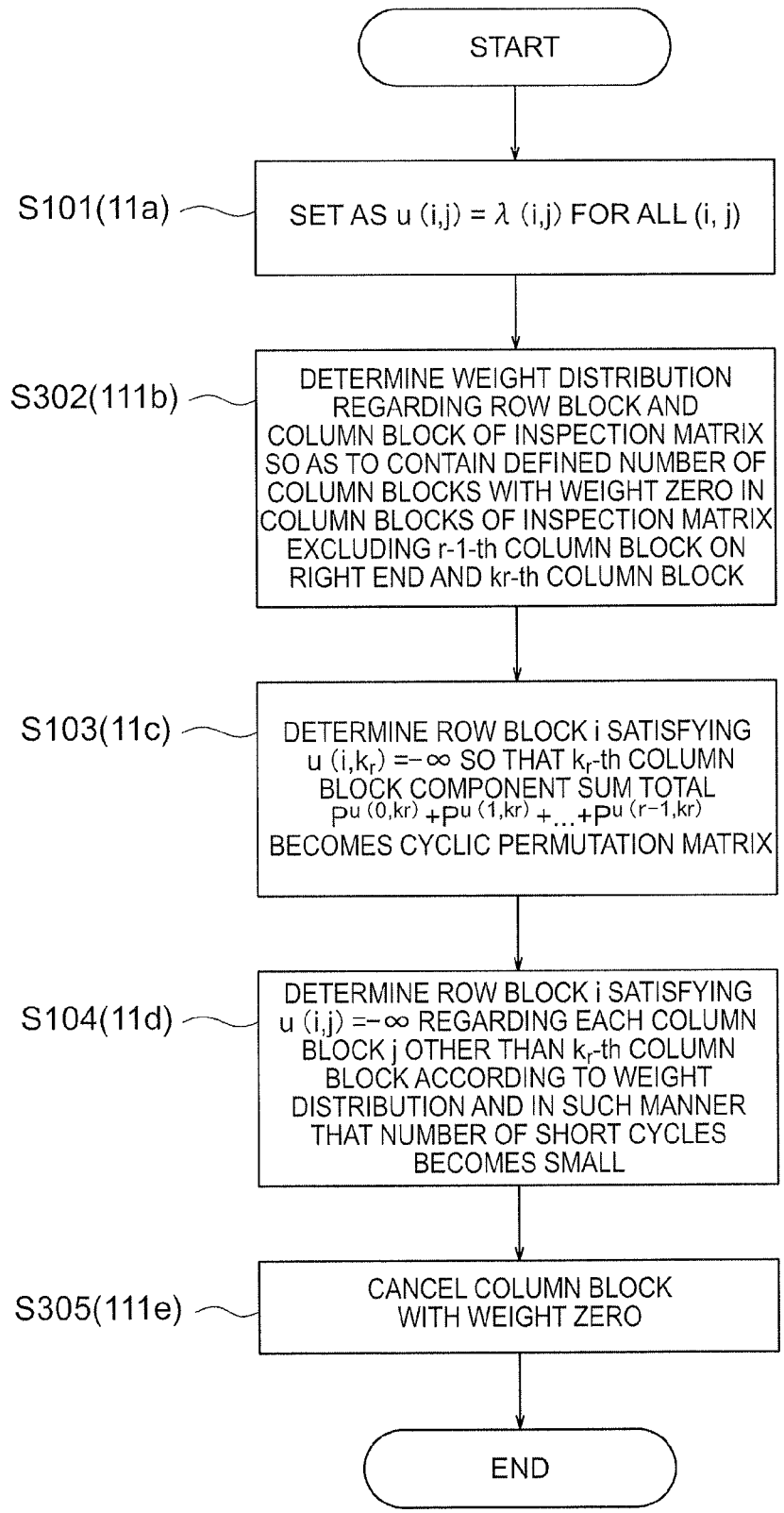
FIG. 10 is a flowchart showing operations for generating a block inspection matrix executed by the inspection matrix generating module shown in FIG. 8.
Figure 11:
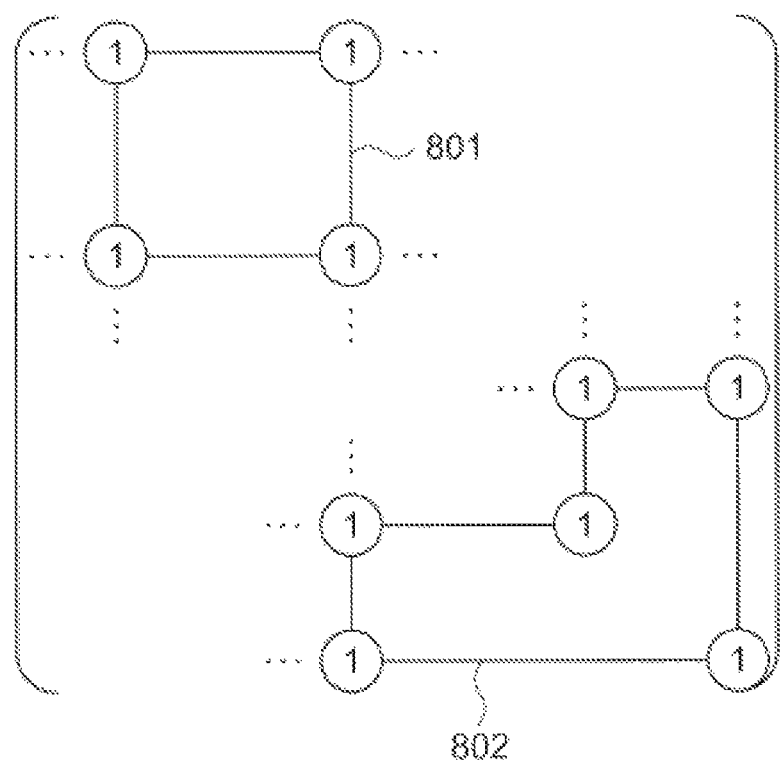
FIG. 11 is an explanatory chart for describing an example of cycles (closed paths) of length 4 and length 6 in the inspection matrix.
Figure 12:
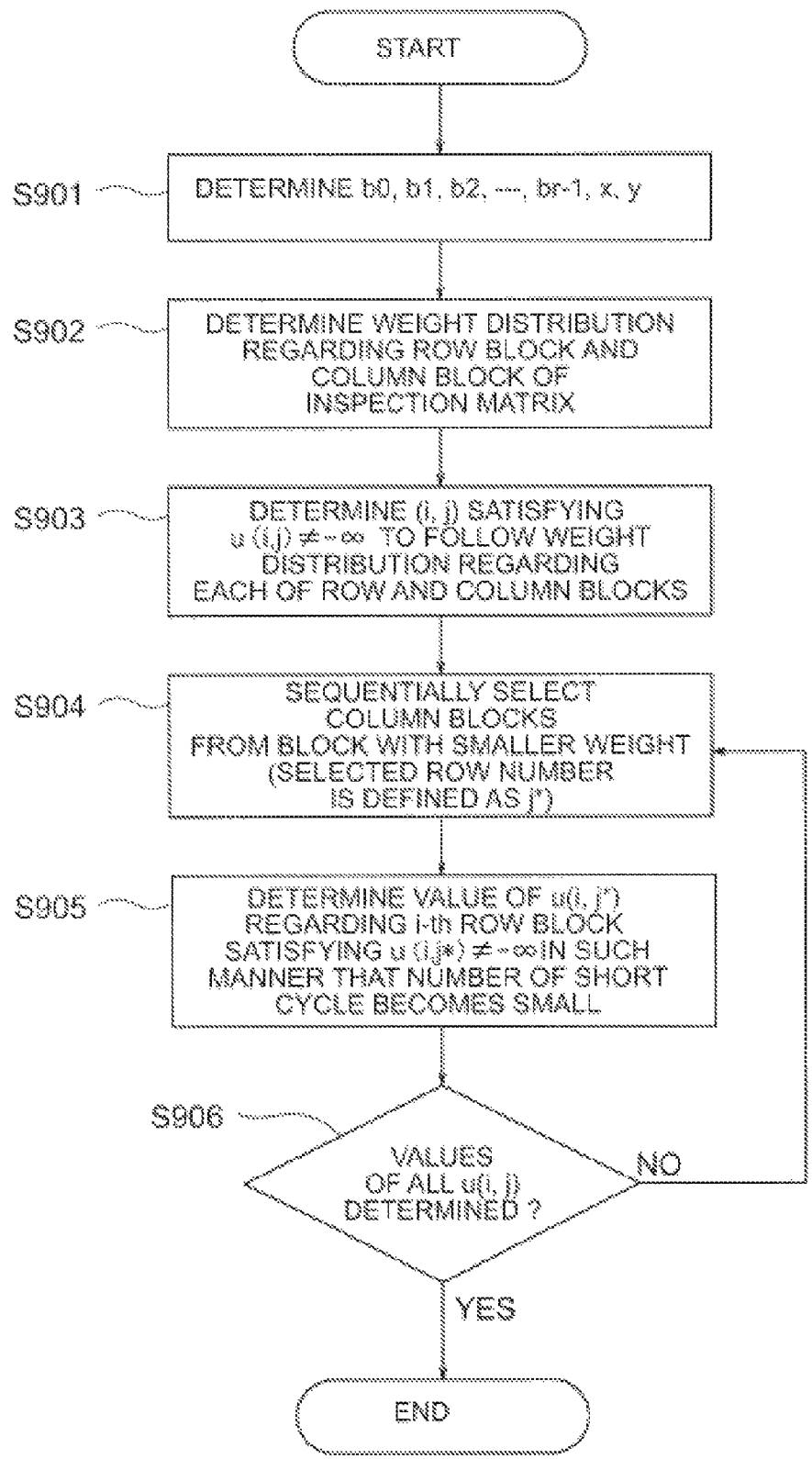
FIG. 12 is a flowchart showing an example of a determining method of u(i, j) according to the techniques depicted in Non-Patent Documents 3 to 4.

FIG. 8 is an explanatory chart showing a communication system 101 including the coding device 110 according to the second exemplary embodiment of the present invention. The communication system 101 has the same structure as the communication system 1 described in the first exemplary embodiment of the present invention except for the point that the coding device 10 is replaced with the coding device 110. The coding device 110 includes an inspection matrix generating module 111 and a coding module 12 same as that of the first exemplary embodiment, FIG. 9 is an explanatory chart showing a more detailed structure of the inspection matrix generating module 111 shown in FIG. 8. Further, FIG. 10 is a flowchart showing operations for generating a block inspection matrix executed by the inspection matrix generating module 111 shown in FIG. 8. The inspection matrix generating module 111 has the same structure as that of the inspection matrix generating module 11 (shown in FIG. 2) according to the first exemplary embodiment except for the point that the weight distribution determination unit 11b of the inspection matrix generating module 11 according to the first exemplary embodiment is replaced with a weight distribution determination unit 111b and that a column block cancel unit 111e is provided additionally.

The inspection matrix generating module 111 can generate a block inspection matrix in which the row block number is r, the column block number is q+1 (q is a power of 2), and the components of the i-th row block and the j-th column block (i is an integer between 0 and r−1, j is an integer between 0 and q) are both a zero matrix or a q−1 cyclic permutation matrix having a function value $\lambda(j-i)$ as the degree.

The operation of the degree allocation unit 11a (step S101) is the same as that of the inspection matrix generating module 11 (shown in FIG. 3). Upon receiving that, the weight distribution determination unit 111b can set the number of column blocks of the inspection matrix to be generated as an arbitrary number of r+1 and q+1, inclusive, by setting the column blocks with zero weight among the column blocks excluding the r−1 piece of the column block on the right end and the k_r-th column block (step S302).

The subsequent operations of the first degree-altering unit 11c and the second degree-altering unit 11d (steps S103 to 104) are the same as those described in FIGS. 2 to 3. Then, the inspection matrix generating module 111 cancels the column blocks with the zero weight by the column block cancel unit 111e thereafter (step S305), and the operation thereof is ended.

There is no change in the minimum value of the cycle length even when the row and column number of the cyclic permutation matrix and the zero matrix as the components of the block inspection matrix is set to an arbitrary number of a multiplication of q−1. Thus, it is possible to generate the block inspection matrix having the cyclic permutation matrix or the zero matrix whose row and column number is an arbitrary positive multiplication of q−1 by using the modules shown in FIGS. 8 to 10.

Further, regarding the inspection matrix generated by the inspection matrix generating module 111 in which the row block number r, the column block number n, and the row number and the column number to be the components thereof are both t×(q−1) (t is a positive integer), the coding module 12 shown in FIG. 5 can calculate and output the redundant bits of r×t×(q−1) bits for the information bits of (n−r)×t×(q−1) bits.

While the present invention has been described by referring to the specific exemplary embodiments illustrated in the drawings, the present invention is not limited only to those exemplary embodiments described above. Any other known structures can be employed, as long as the effects of the present invention can be achieved therewith.

The new technical contents of the above-described exemplary embodiment can be summarized as follows. While a part of or a whole part of the exemplary embodiments can be summarized as follows as the new technique, the present invention is not necessarily limited only to the followings.

(Supplementary Note 1)

A coding device for structuring a quasi-cyclic low-density-parity-check code, which includes: an inspection matrix generating module which generates a block inspection matrix of the quasi-cyclic low-density-parity-check code that has a cyclic permutation matrix where number of rows and number of columns are both q−1 or a zero matrix as components (q is an integer of 4 or larger and a power of 2), number of row blocks is r and number of column blocks is q+1 (r is an integer between 4 and q, inclusive), and i-th row block and j-th column block components (i is an integer between 0 and r−1, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer j−i as an argument; and a coding module which generates and outputs a code word by the block inspection matrix from an inputted message, wherein the inspection matrix generating module further includes: a degree allocation unit which prescribes the function value $\lambda(j-i)$ of the block inspection matrix by a coefficient of a self-reciprocal polynomial having q−1 pieces of elements of Galois field GF ($q^2$) as roots; a weight distribution determination unit which prescribes number of components to be a nonzero matrix among components of each column block of the block inspection matrix and number of components to be a nonzero matrix among components of each row block of the block inspection matrix by using a given mask pattern; a first degree-altering unit which takes sum total of components of k_r-th block (k_r is an integer part of (q+1−r)/2) of the block inspection matrix as a cyclic permutation matrix; and a second degree-altering unit which prescribes row block number of components to be a nonzero matrix among the components of each column block excluding the k_r-th column block of the block inspection matrix.

(Supplementary Note 2)

The coding device as depicted in Supplementary Note 1, wherein: the weight distribution determination unit of the inspection matrix generating module defines all the components of q+1−n pieces of column blocks among q+1−r pieces of column blocks excluding r−1 pieces of column blocks on right end and the k_r-th column block of q+1 pieces of column blocks of the block inspection matrix as zero matrices; and the inspection matrix generating module includes a column block cancel unit which cancels the q+1−n pieces of column blocks whose entire components are zero matrices.

(Supplementary Note 3)

The coding device as depicted in Supplementary Note 1 or 2, wherein the coding module includes: a matrix data saving memory which stores the block inspection matrix generated by the inspection matrix generating module and the mask pattern; r-pieces of matrix multiplication devices which calculate matrix products of information bit strings of the message and the cyclic permutation matrix whose degree is the value of the function $\lambda(j-i)$ having the integer $j-i$ prescribed by the coefficient of the self-reciprocal polynomial having the $q-1$ pieces of elements of the Galois field GF $(q^2)$ as the roots as the argument; and a selector which switches input signals to the matrix multiplication devices according to the mask pattern held to the matrix data saving memory.

(Supplementary Note 4)

The coding device as depicted in Supplementary Note 3, wherein the matrix data saving memory includes: a function which holds row numbers of all the row blocks whose components in the column blocks are nonzero cyclic permutation matrices in all the column blocks of a plurality of the block inspection matrices; and a function which alters input signals to the selector for each of the block inspection matrices.

(Supplementary Note 5)

An error-correction code configuration method for structuring a quasi-cyclic low-density-parity-check code, which includes: generating, by an inspection matrix generating module, a block inspection matrix of the quasi-cyclic low-density-parity-check code that has a cyclic permutation matrix where number of rows and number of columns are both $q-1$ or a zero matrix as components (q is an integer of 4 or larger and a power of 2), number of row blocks is r and number of column blocks is $q+1$ (r is an integer between 4 and q, inclusive), and i-th row block and j-th column block components (i is an integer between 0 and $r-1$, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer $j-i$ as an argument; and generating and outputting, by a coding module, a code word by the block inspection matrix from an inputted message. The method further includes: when generating the block inspection matrix, prescribing, by a degree allocation unit, the function value $\lambda(j-i)$ of the block inspection matrix by a coefficient of a self-reciprocal polynomial having $q-1$ pieces of elements of Galois field GF $(q^2)$ as roots;

prescribing, by a weight distribution determination unit, number of components to be a nonzero matrix among components of each column block of the block inspection matrix and number of components to be a nonzero matrix among components of each row block of the block inspection matrix by using a given mask pattern; taking, by a first degree-altering unit, sum total of components of k_r-th block (k_r is an integer part of $(q+1-r)/2$) of the block inspection matrix as a cyclic permutation matrix; and prescribing, by a second degree-altering unit, row block number of components to be a nonzero matrix among the components of each column block excluding the k_r-th column block of the block inspection matrix.

(Supplementary Note 6)

The error-correction code configuration method as depicted in Supplementary Note 5, which includes: storing the block inspection matrix generated by the inspection matrix generating module and the mask pattern to a matrix data saving memory of the coding module; switching input signals by a selector of the coding module according to the mask pattern held to the matrix data saving memory; and calculating, by a matrix multiplication device of the coding module, matrix products of information bit strings of the message and the cyclic permutation matrix whose degree is the value of the function $\lambda(j-i)$ having the integer $j-i$ prescribed by the coefficient of the self-reciprocal polynomial having the $q-1$ pieces of elements of the Galois field GF $(q^2)$ as the roots as the argument.

(Supplementary Note 7)

An error-correction code configuration program for structuring a quasi-cyclic low-density-parity-check code, which causes a computer to execute: a function of generating a block inspection matrix of the quasi-cyclic low-density-parity-check code that has a cyclic permutation matrix where number of rows and number of columns are both $q-1$ or a zero matrix as components (q is an integer of 4 or larger and a power of 2) is r and number of column blocks is $q+1$ (r is an integer between 4 and q, inclusive), and i-th row block and j-th column block components (i is an integer between 0 and $r-1$, j is an integer between 0 and q, left-end column of the matrix is defined as 0th column, and top-end row is defined as 0th row) match a zero matrix or a cyclic permutation matrix whose degree is a value of a function $\lambda(j-i)$ having an integer $j-i$ as an argument; and a function of generating and outputting a code word by the block inspection matrix from an inputted message, and the program further causes the computer, when generating the block inspection matrix, to execute: a function of prescribing the function value $\lambda(j-i)$ of the block inspection matrix by a coefficient of a self-reciprocal polynomial having $q-1$ pieces of elements of Galois field GF $(q^2)$ as roots; a function of prescribing number of components to be a nonzero matrix among components of each column block of the block inspection matrix and number of components to be a nonzero matrix among components of each row block of the block inspection matrix by using a given mask pattern; a function of taking sum total of components of k_r-th block (k_r is an integer part of $(q+1-r)/2$) of the block inspection matrix as a cyclic permutation matrix; and a function of prescribing row block number of components to be a nonzero matrix among the components of each column block excluding the k_r-th column block of the block inspection matrix.

(Supplementary Note 8)

The error-correction code configuration program as depicted in Supplementary Note 7, which causes the computer to execute: a function of storing the generated block inspection matrix and the mask pattern to a matrix data saving memory of the coding module; a function of switching input signals according to the mask pattern held to the matrix data saving memory; and a function of calculating matrix products of information bit strings of the message and the cyclic permutation matrix whose degree is the value of the function $\lambda(j-i)$ having the integer $j-i$ prescribed by the coefficient of the self-reciprocal polynomial having the $q-1$ pieces of elements of the Galois field GF $(q^2)$ as the roots as the argument.

While the present invention has been described heretofore by referring to the embodiments (and EXAMPLES), the present invention is not limited only to the embodiments (and EXAMPLES). Various changes and modifications occurred to those skilled in the art can be applied to the structures and details of the present invention without departing from the scope of the present invention.

This Application claims the Priority right based on Japanese Patent Application No. 2010-102479 filed on Apr. 27, 2010 and the disclosure thereof is hereby incorporated by reference in its entirety.

INDUSTRIAL APPLICABILITY

The present invention can be employed as an error correction technique for satisfying the requirements in terms of the system structure such as achieving high reliability due to deterioration in the bit error rate and reduction in the required electric power in various kinds of communication systems or as an error correction technique for improving the reliability regarding a storage device such as a magnetic record.

REFERENCE NUMERALS 1, 101 Communication system
10, 110 Coding device
11, 111 Inspection matrix generating module
11a Degree-allocation unit
11b, 112b Weight distribution determination unit
11c First degree-altering unit
11d Second degree-altering unit
12 Coding module
21 Modulator
22 Transmission path
23 Demodulator
24 Decoding device
30 Matrix multiplication device
32, 36 Selector
33 Matrix data saving memory
34, 35 Exclusive OR calculation device
111e Column block cancel unit

The invention claimed is:

1. A coding device for structuring a quasi-cyclic low-density-parity-check code, generating a code word from an inputted message by using the quasi-cyclic low-density-parity-check code, and outputting the code word, the coding device comprising:

an inspection matrix generating module which generates a block inspection matrix of the quasi-cyclic low-density-parity-check code that has a cyclic permutation matrix where a number of rows and a number of columns are both $q-1$ or a zero matrix as components, wherein q is an integer of 4 or larger and a power of 2, a number of row blocks is r and a number of column blocks is $q+1$, wherein r is an integer between 4 and q, inclusive, and i-th row block and j-th column block components match a zero matrix or a cyclic permutation matrix whose degree is a value of a function $\lambda(j-i)$ which is prescribed by a coefficient of a self-reciprocal polynomial having $q-1$ pieces of elements of a Galois field GF ($q^2$) as roots, having an integer $j-i$ as an argument wherein i is an integer between 0 and $r-1$, j is an integer between 0 and q, a left-end column of the matrix is defined as a 0th column, and a top-end row is defined as a 0th row; and a coding module which generates and outputs a code word by using the block inspection matrix from an inputted message, wherein the inspection matrix generating module further comprises:
a degree allocation unit which prescribes the function value $\lambda(j-i)$ of the block inspection matrix;
a weight distribution determination unit which prescribes a number of components to be a nonzero matrix among components of each column block of the block inspection matrix and a number of components to be a nonzero matrix among components of each row block of the block inspection matrix by using a mask pattern defined in advance;
a first degree-altering unit which takes a sum total of components of a k_r-th block of the block inspection matrix as a cyclic permutation matrix, wherein k_r is an integer part $(q+1-r)/2$; and a second degree-altering unit which prescribes a row block number of each of the components to be a nonzero matrix among the components of each column block excluding the k_r-th column block of the block inspection matrix.

2. The coding device as claimed in claim 1, wherein:
the weight distribution determination unit of the inspection matrix generating module defines all components of $q+1-n$ pieces of column blocks among $q+1-r$ pieces of column blocks excluding $r-1$ pieces of column blocks on a right end and the k_r-th column block of $q+1$ pieces of column blocks of the block inspection matrix as zero matrices, wherein n is a column block number of the block inspections matrix; and
the inspection matrix generating module comprises a column block cancel unit which cancels the $q+1-n$ pieces of column blocks whose entire components are zero matrices.

3. The coding device as claimed in claim 1, wherein the coding module comprises:
a matrix data saving memory which stores the block inspection matrix generated by the inspection matrix generating module and the mask pattern;
r-pieces of matrix multiplication devices which calculate matrix products of information bit strings of the message and the cyclic permutation matrix whose degree is the value of the function $\lambda(j-i)$ having the integer $j-i$ prescribed by the coefficient of the self-reciprocal polynomial having the $q-1$ pieces of elements of the Galois field GF ($q^2$) as the roots as an argument; and
a selector which switches input signals to the matrix multiplication devices according to the mask pattern held to the matrix data saving memory.

4. The coding device as claimed in claim 3, wherein the matrix data saving memory comprises:
a function which holds row numbers of all the row blocks whose components in the column blocks are nonzero cyclic permutation matrices in all the column blocks of a plurality of the block inspection matrices; and
a function which alters input signals to the selector for each of the block inspection matrices.

5. An error-correction code configuration method for structuring a quasi-cyclic low-density-parity-check code, generating a code word from an inputted message by using the quasi-cyclic low-density-parity-check code, and outputting the code word, the method comprising:
generating, by an inspection matrix generating module, a block inspection matrix of the quasi-cyclic low-density-parity-check code that has a cyclic permutation matrix where a number of rows and a number of columns are both $q-1$ or a zero matrix as components, wherein q is an integer of 4 or larger and a power of 2, a number of row blocks is r and a number of column blocks is $q+1$, wherein r is an integer between 4 and q, inclusive, and i-th row block and j-th column block components match a zero matrix or a cyclic permutation matrix whose degree is a value of a function $\lambda(j-i)$ which is prescribed by a coefficient of a self-reciprocal polynomial having $q-1$ pieces of elements of a Galois field GF ($q^2$) as roots, having an integer $j-i$ as an argument wherein i is an integer between 0 and $r-1$, j is an integer between 0 and q, a left-end column of the matrix is defined as a 0th column, and a top-end row is defined as a 0th row; and
generating and outputting, by a coding module, a code word by using the block inspection matrix from an inputted message, and the method further comprising:
when generating the block inspection matrix,
prescribing, by a degree allocation unit, the function value $\lambda(j-i)$ of the block inspection matrix;

prescribing, by a weight distribution determination unit, a number of components to be a nonzero matrix among components of each column block of the block inspection matrix and a number of components to be a nonzero matrix among components of each row block of the block inspection matrix by using a mask pattern defined in advance;

taking, by a first degree-altering unit, a sum total of components of a k_r-th block of the block inspection matrix as a cyclic permutation matrix wherein k_r is an integer part (q+1−r)/2; and prescribing, by a second degree-altering unit, a row block number of each of the components to be a nonzero matrix among the components of each column block excluding the k_r-th column block of the block inspection matrix.

6. The error-correction code configuration method as claimed in claim 5, comprising:

storing the block inspection matrix generated by the inspection matrix generating module and the mask pattern to a matrix data saving memory of the coding module;

switching input signals by a selector of the coding module according to the mask pattern held to the matrix data saving memory; and calculating, by a matrix multiplication device of the coding module, matrix products of information bit strings of the message and the cyclic permutation matrix whose degree is the value of the function $\lambda(j-i)$ having the integer $j-i$ prescribed by the coefficient of the self-reciprocal polynomial having the q−1 pieces of elements of the Galois field GF $(q^2)$ as the roots as an argument.

7. A non-transitory computer readable recording medium storing an error-correction code configuration program for structuring a quasi-cyclic low-density-parity-check code, generating a code word from an inputted message by using the quasi-cyclic low-density-parity-check code, and outputting the code word, which causes a computer to execute:

a function of generating a block inspection matrix of the quasi-cyclic low-density-parity-check code that has a cyclic permutation matrix where a number of rows and a number of columns are both q−1 or a zero matrix as components, wherein q is an integer of 4 or larger and a power of 2, a number of row blocks is r and a number of column blocks is q+1, wherein r is an integer between 4 and q, inclusive, and i-th row block and j-th column block components match a zero matrix or a cyclic permutation matrix whose degree is a value of a function $\lambda(j-i)$ which is prescribed by a coefficient of a self-reciprocal polynomial having q−1 pieces of elements of a Galois field GF $(q^2)$ as roots, having an integer $j-i$ as an argument, wherein i is an integer between 0 and r−1, j is an integer between 0 and q, a left-end column of the matrix is defined as a 0th column, and a top-end row is defined as a 0th row; and a function of generating and outputting a code word by using the block inspection matrix from an inputted message, and further causes the computer, when generating the block inspection matrix, to execute:

a function of prescribing the function value $\lambda(j-i)$ of the block inspection matrix;

a function of prescribing a number of components to be a nonzero matrix among components of each column block of the block inspection matrix and a number of components to be a nonzero matrix among components of each row block of the block inspection matrix by using a mask pattern defined in advance;

a function of taking a sum total of components of a k_r-th block of the block inspection matrix as a cyclic permutation matrix wherein k_r is an integer part (q+1−r)/2; and a function of prescribing a row block number of each of the components to be a nonzero matrix among the components of each column block excluding the k_r-th column block of the block inspection matrix.

8. The non-transitory computer readable recording medium storing the error-correction code configuration program as claimed in claim 7, which causes the computer to execute:

a function of storing the generated block inspection matrix and the mask pattern to a matrix data saving memory of the coding module;

a function of switching input signals according to the mask pattern held to the matrix data saving memory; and a function of calculating matrix products of information bit strings of the message and the cyclic permutation matrix whose degree is the value of the function $\lambda(j-i)$ having the integer $j-i$ prescribed by the coefficient of the self-reciprocal polynomial having the q−1 pieces of elements of the Galois field GF $(q^2)$ as the roots as an argument.

9. A coding device for structuring a quasi-cyclic low-density-parity-check code, generating a code word from an inputted message by using the quasi-cyclic low-density-parity-check code, and outputting the code word, the coding device comprising:

inspection matrix generating means for generating a block inspection matrix of the quasi-cyclic low-density-parity-check code that has a cyclic permutation matrix where a number of rows and a number of columns are both q−1 or a zero matrix as components, wherein q is an integer of 4 or larger and a power of 2, a number of row blocks is r and a number of column blocks is q+1, wherein r is an integer between 4 and q, inclusive, and i-th row block and j-th column block components match a zero matrix or a cyclic permutation matrix whose degree is a value of a function $\lambda(j-i)$ which is prescribed by a coefficient of a self-reciprocal polynomial having q−1 pieces of elements of a Galois field GF $(q^2)$ as roots, having an integer $j-i$ as an argument, wherein i is an integer between 0 and r−1, j is an integer between 0 and q, a left-end column of the matrix is defined as a 0th column, and a top-end row is defined as a 0th row; and coding means for generating and outputting a code word by using the block inspection matrix from an inputted message, wherein the inspection matrix generating means further comprises:

degree allocation means for prescribing the function value $\lambda(j-i)$ of the block inspection matrix;

weight distribution determination means for prescribing a number of components to be a nonzero matrix among components of each column block of the block inspection matrix and a number of components to be a nonzero matrix among components of each row block of the block inspection matrix by using a mask pattern defined in advance;

first degree-altering means for taking a sum total of components of k_r-th block of the block inspection matrix as a cyclic permutation matrix wherein k_r is an integer part (q+1−r)/2; and second degree-altering means for prescribing a row block number of each of the components to be a nonzero matrix among the components of each column block excluding the k_r-th column block of the block inspection matrix.

\* \* \* \* \*

UNITED STATES PATENT AND TRADEMARK OFFICE
CERTIFICATE OF CORRECTION

| | | |
|---|---|---|
| PATENT NO. | : 8,910,014 B2 | Page 1 of 2 |
| APPLICATION NO. | : 13/640568 | |
| DATED | : December 9, 2014 | |
| INVENTOR(S) | : Norifumi Kamiya | |

It is certified that error appears in the above-identified patent and that said Letters Patent is hereby corrected as shown below:

In the Specification

Column 2, Line 18: Delete ""A^B"" and insert -- "A_B" --

Column 10, Line 11: Delete " $g(x) = x \sum_{h=-(q-2)/2}^{(q-2)/2} (x - \beta^{h(q-1)})$ " and insert -- $g(x) = x \prod_{h=-(q-2)/2}^{(q-2)/2} (x - \beta^{h(q-1)})$ --

Column 10, Line 34: Delete "g_t=g _(q+2-t)" and insert -- g_t=g_(q+1-t) --

Column 10, Line 56: Delete "(Equation" and insert -- (Expression --

Column 14, Line 61: Delete " $\sum_{j=0}^{k-1} P^{m(i,j)*u(i,j)} (a_0^{(j)}, a_1^{(j)}, \ldots, a_{q-2}^{(j)})^T$ " and insert -- $\sum_{j=0}^{k-1} P^{m(i,j)*u(i,j)} (a_0^{(j)}, a_1^{(j)}, \ldots, a_{q-2}^{(j)})^T$ --

Column 14, Line 66: Delete "b^(q-2)^(i)," and insert -- b_(q-2)^(i), --

Signed and Sealed this
Twenty-eighth Day of July, 2015

Michelle K. Lee
*Director of the United States Patent and Trademark Office*

CERTIFICATE OF CORRECTION (continued)
U.S. Pat. No. 8,910,014 B2

Column 15, Line 30: Delete

" $(P_0^{(1)}, P_1^{(1)}, \ldots, P_{q-2}^{(1)})^T = (b_0^{(0)}, b_1^{(0)}, \ldots, b_{q-2}^{(0)})^T$
$(P_0^{(i)}, P_1^{(i)}, \ldots, P_{q-2}^{(i)})^T = (b_0^{(i-1)}, b_1^{(i-1)}, \ldots b_{q-2}^{(i-1)})^T + (p_0^{(i-1)}, p_1^{(i-1)}, \ldots, p_{q-2}^{(i-1)})^T$ " and insert -- $(P_0^{(1)}, P_1^{(1)}, \ldots, P_{q-2}^{(1)})^T = (b_0^{(0)}, b_1^{(0)}, \ldots, b_{q-2}^{(0)})^T$
$(P_0^{(i)}, P_1^{(i)}, \ldots, P_{q-2}^{(i)})^T = (b_0^{(i-1)}, b_1^{(i-1)}, \ldots, b_{q-2}^{(i-1)})^T + (p_0^{(i-1)}, p_1^{(i-1)}, \ldots, p_{q-2}^{(i-1)})^T$ --

Column 15, Line 54: Delete "β^6+β1=0." and insert -- β^6+β+1=0. --